United States Patent
Yu et al.

(10) Patent No.: US 12,333,671 B2
(45) Date of Patent: Jun. 17, 2025

(54) DATA QUANTIZATION PROCESSING METHOD AND APPARATUS, ELECTRONIC DEVICE AND STORAGE MEDIUM

(71) Applicant: Cambricon Technologies Corporation Limited, Beijing (CN)

(72) Inventors: Xin Yu, Beijing (CN); Daofu Liu, Beijing (CN); Shiyi Zhou, Beijing (CN)

(73) Assignee: Cambricon Technologies Corporation Limited, Beijing (CN)

( * ) Notice: Subject to any disclaimer, the term of this patent is extended or adjusted under 35 U.S.C. 154(b) by 299 days.

(21) Appl. No.: 17/801,999

(22) PCT Filed: Feb. 22, 2021

(86) PCT No.: PCT/CN2021/077235
§ 371 (c)(1),
(2) Date: Aug. 24, 2022

(87) PCT Pub. No.: WO2021/169914
PCT Pub. Date: Sep. 2, 2021

(65) Prior Publication Data
US 2023/0091541 A1    Mar. 23, 2023

(30) Foreign Application Priority Data
Feb. 24, 2020    (CN) .......................... 202010111884.3

(51) Int. Cl.
*G06T 3/40*         (2024.01)
*G06F 17/15*       (2006.01)
(Continued)

(52) U.S. Cl.
CPC .............. *G06T 3/40* (2013.01); *G06F 17/153* (2013.01); *G06N 3/0464* (2023.01);
(Continued)

(58) Field of Classification Search
CPC ...... G06N 3/063; G06N 3/082; G06N 3/0464; G06N 3/02; G06N 3/0985; G06N 3/0495;
(Continued)

(56) References Cited

U.S. PATENT DOCUMENTS

| 5,052,043 A | 9/1991 | Gaborski |
| 6,144,977 A | 11/2000 | Giangarra et al. |

(Continued)

FOREIGN PATENT DOCUMENTS

| CN | 1503858 A | 6/2004 |
| CN | 1503958 A | 6/2004 |

(Continued)

OTHER PUBLICATIONS

Jin et al., AdaBits: Neural Network Quantization with Adaptive Bit-Widths, Dec. 20, 2019 [retrieved Nov. 6, 2024], Cornell University: arXiv, version: [v1], 10 pages. https://doi.org/10.48550/arXiv.1912.09666 (Year: 2019).*

(Continued)

*Primary Examiner* — Henok Shiferaw
*Assistant Examiner* — Dennis Rosario
(74) *Attorney, Agent, or Firm* — Rimon PC

(57) ABSTRACT

The present disclosure relates to a data quantization processing method and apparatus, an electronic device, and a storage medium. The apparatus includes a control unit having an instruction caching unit, an instruction processing unit, and a storage queue unit. The instruction caching unit is configured to store a calculation instruction associated with an artificial neural network operation, the instruction processing unit is configured to parse the calculation instruction to obtain a plurality of operation instructions, and the storage queue unit is configured to store an instruction queue. The instruction queue includes a plurality of operation instructions or calculation instructions to be executed in (Continued)

an order of the queue. The above-mentioned method improves the operation precision of related products during a neural network model operation.

17 Claims, 6 Drawing Sheets

(51) Int. Cl.
| | |
|---|---|
| *G06N 3/0464* | (2023.01) |
| *G06N 3/0495* | (2023.01) |
| *G06T 7/70* | (2017.01) |
| *G06T 9/00* | (2006.01) |
| *G06V 10/44* | (2022.01) |
| *G06V 10/70* | (2022.01) |
| *H03M 7/24* | (2006.01) |
| *H04N 19/124* | (2014.01) |
| *H04N 19/94* | (2014.01) |

(52) U.S. Cl.
CPC ............. *G06N 3/0495* (2023.01); *G06T 7/70* (2017.01); *G06T 9/002* (2013.01); *G06T 2207/20084* (2013.01); *G06V 10/454* (2022.01); *G06V 10/70* (2022.01); *H03M 7/24* (2013.01); *H04N 19/124* (2014.11); *H04N 19/94* (2014.11)

(58) Field of Classification Search
CPC .......... G06N 3/047; G06N 3/08; G06N 3/045; G06N 20/00; G06N 3/048; G06N 3/04; G06F 11/1476; G06F 9/30025; G06F 17/15; G06F 7/49915; G06F 7/4991; G06F 7/49921; G06F 2207/4824; G06F 17/153; G06F 5/012; G06F 7/49947; G06F 17/18; G06T 2207/20084; G06T 3/4046; G06T 9/00; G06T 9/008; G06T 1/60; G06T 9/002; G06T 3/40; G06T 2207/20081; G06T 7/70; G06T 7/187; H03M 13/6577; H03M 7/24; H03M 7/46; H03M 3/424; H03M 3/422; H03M 3/43; H03M 3/412; H03M 3/416; H03M 3/414; H03M 3/418; H03M 3/42; H03M 3/426; H03M 3/428; H03M 3/432; H03M 3/434; H03M 13/6594; H03M 3/454; H03M 3/368; H03M 7/3026; G06V 10/82; G06V 10/28; G06V 10/454; H04N 19/124; H04N 19/126; H04N 19/186; H04N 19/94

See application file for complete search history.

(56) References Cited

U.S. PATENT DOCUMENTS

| | | | |
|---|---|---|---|
| 6,145,123 A | 11/2000 | Torrey et al. | |
| 6,570,588 B1 | 5/2003 | Ando et al. | |
| 6,671,796 B1 | 12/2003 | Sudharsanan et al. | |
| 6,704,757 B1 | 3/2004 | Ohmi et al. | |
| 6,715,065 B1 | 3/2004 | Ebata et al. | |
| 6,732,307 B1 | 5/2004 | Edwards | |
| 6,931,639 B1 | 8/2005 | Eickemeyer | |
| 7,093,005 B2 | 8/2006 | Patterson | |
| 7,236,995 B2 | 6/2007 | Hinds | |
| 7,242,414 B1 | 7/2007 | Thekkath et al. | |
| 7,406,451 B2 | 7/2008 | Mrziglod et al. | |
| 7,721,128 B2 | 5/2010 | Johns et al. | |
| 7,945,607 B2 | 5/2011 | Hinds | |
| 8,015,543 B1 | 9/2011 | Carrick et al. | |
| 8,051,117 B2 | 11/2011 | Lundvall et al. | |
| 8,190,664 B2 | 5/2012 | Lundvall et al. | |
| 8,335,811 B2 | 12/2012 | Zhong | |
| 8,560,591 B2 | 10/2013 | Lundvall et al. | |
| 8,694,572 B2 | 4/2014 | Samy et al. | |
| 8,762,438 B2 | 6/2014 | Lundvall et al. | |
| 8,924,455 B1 | 12/2014 | Barman et al. | |
| 9,052,896 B2 | 6/2015 | Schillings | |
| 9,412,366 B2 | 8/2016 | Wilensky et al. | |
| 9,916,531 B1 | 3/2018 | Zivkovic et al. | |
| 10,187,568 B1 | 1/2019 | Tran et al. | |
| 10,224,954 B1 | 3/2019 | Madduri et al. | |
| 10,360,304 B1 | 7/2019 | Alvarez et al. | |
| 10,427,306 B1 | 10/2019 | Quinlan et al. | |
| 10,656,942 B2 | 5/2020 | Madduri et al. | |
| 10,699,465 B1 | 6/2020 | Surti et al. | |
| 10,929,744 B2 | 2/2021 | Li et al. | |
| 11,675,676 B2 * | 6/2023 | Liu ........................ | G06N 3/084 |
| | | | 714/1 |
| 11,676,028 B2 * | 6/2023 | Liu ........................ | G06N 20/00 |
| | | | 706/25 |
| 11,676,029 B2 * | 6/2023 | Liu ........................ | G06N 3/045 |
| | | | 706/25 |
| 12,001,955 B2 * | 6/2024 | Liu ........................ | G06N 3/04 |
| 12,093,148 B2 * | 9/2024 | Liu ........................ | G06N 3/048 |
| 12,112,257 B2 * | 10/2024 | Liu ........................ | G06N 3/08 |
| 2002/0138714 A1 | 9/2002 | Leibholz et al. | |
| 2003/0097318 A1 | 5/2003 | Yu et al. | |
| 2003/0154360 A1 | 8/2003 | Ganapathy et al. | |
| 2003/0167460 A1 | 9/2003 | Desai et al. | |
| 2004/0128331 A1 | 7/2004 | Hinds et al. | |
| 2004/0250164 A1 | 12/2004 | Ahmad et al. | |
| 2005/0138327 A1 | 6/2005 | Tabei | |
| 2005/0160402 A1 | 7/2005 | Wang et al. | |
| 2006/0161375 A1 | 7/2006 | Duberstein et al. | |
| 2007/0220076 A1 | 9/2007 | Hinds | |
| 2008/0148120 A1 | 6/2008 | Seuring | |
| 2009/0113186 A1 | 4/2009 | Kato et al. | |
| 2009/0125293 A1 | 5/2009 | Lefurgy et al. | |
| 2010/0073068 A1 | 3/2010 | Cho et al. | |
| 2011/0060587 A1 | 3/2011 | Phillips et al. | |
| 2011/0301777 A1 | 12/2011 | Cox et al. | |
| 2012/0316845 A1 | 12/2012 | Grey et al. | |
| 2013/0054110 A1 | 2/2013 | Sata | |
| 2013/0173891 A1 | 7/2013 | Carlough et al. | |
| 2013/0332610 A1 | 12/2013 | Beveridge | |
| 2014/0019732 A1 | 1/2014 | Toll et al. | |
| 2014/0081625 A1 | 3/2014 | Wilensky et al. | |
| 2014/0164737 A1 | 6/2014 | Collange et al. | |
| 2014/0249814 A1 | 9/2014 | Nakano et al. | |
| 2015/0134581 A1 | 5/2015 | Doeding et al. | |
| 2015/0339570 A1 | 11/2015 | Scheffler | |
| 2015/0370303 A1 | 12/2015 | Krishnaswamy et al. | |
| 2016/0026231 A1 | 1/2016 | Ignowski et al. | |
| 2016/0054922 A1 | 2/2016 | Awasthi et al. | |
| 2016/0124710 A1 | 5/2016 | Lutz et al. | |
| 2016/0170710 A1 | 6/2016 | Kim et al. | |
| 2016/0170866 A1 | 6/2016 | Ioualalen et al. | |
| 2016/0239259 A1 | 8/2016 | Lenchner et al. | |
| 2016/0328645 A1 | 11/2016 | Lin et al. | |
| 2016/0328647 A1 | 11/2016 | Lin et al. | |
| 2017/0061279 A1 | 3/2017 | Yang et al. | |
| 2017/0090956 A1 | 3/2017 | Linsky | |
| 2017/0103022 A1 | 4/2017 | Kreinin et al. | |
| 2017/0103316 A1 | 4/2017 | Ross et al. | |
| 2017/0116520 A1 | 4/2017 | Min et al. | |
| 2017/0142327 A1 | 5/2017 | Bayani | |
| 2017/0161604 A1 | 6/2017 | Craddock et al. | |
| 2017/0213156 A1 | 7/2017 | Hammond et al. | |
| 2017/0220929 A1 | 8/2017 | Rozen et al. | |
| 2017/0221176 A1 | 8/2017 | Munteanu et al. | |
| 2017/0243085 A1 | 8/2017 | Vanhoucke et al. | |
| 2017/0257079 A1 | 9/2017 | Jain et al. | |
| 2017/0262959 A1 | 9/2017 | Lee et al. | |
| 2017/0270073 A1 | 9/2017 | Badin et al. | |
| 2017/0312634 A1 | 11/2017 | Ledoux et al. | |
| 2017/0316307 A1 | 11/2017 | Koster et al. | |
| 2017/0316312 A1 | 11/2017 | Goyal et al. | |
| 2017/0339339 A1 | 11/2017 | De et al. | |
| 2017/0344880 A1 | 11/2017 | Nekuii | |
| 2017/0344882 A1 | 11/2017 | Ambrose et al. | |
| 2017/0353163 A1 | 12/2017 | Gazneli et al. | |

(56) References Cited

U.S. PATENT DOCUMENTS

| | | |
|---|---|---|
| 2017/0357530 A1 | 12/2017 | Shih et al. |
| 2017/0357910 A1 | 12/2017 | Sommer et al. |
| 2018/0046903 A1 | 2/2018 | Yao et al. |
| 2018/0060719 A1 | 3/2018 | Kisilev et al. |
| 2018/0088996 A1 | 3/2018 | Rossi et al. |
| 2018/0096243 A1 | 4/2018 | Patil et al. |
| 2018/0136912 A1 | 5/2018 | Venkataramani et al. |
| 2018/0157464 A1 | 6/2018 | Lutz et al. |
| 2018/0157971 A1 | 6/2018 | Fusi |
| 2018/0247182 A1 | 8/2018 | Motoya et al. |
| 2018/0270290 A1 | 9/2018 | Sinha et al. |
| 2018/0288440 A1 | 10/2018 | Chao |
| 2018/0293183 A1 | 10/2018 | Cooray et al. |
| 2018/0293517 A1 | 10/2018 | Browne et al. |
| 2018/0300931 A1 | 10/2018 | Vembu et al. |
| 2018/0322391 A1 | 11/2018 | Wu et al. |
| 2018/0329512 A1 | 11/2018 | Liao et al. |
| 2018/0357541 A1 | 12/2018 | Chen et al. |
| 2018/0367729 A1 | 12/2018 | Parasnis et al. |
| 2018/0373976 A1 | 12/2018 | Woo |
| 2019/0034784 A1 | 1/2019 | Li et al. |
| 2019/0042925 A1 | 2/2019 | Choe et al. |
| 2019/0042935 A1 | 2/2019 | Deisher |
| 2019/0050710 A1 | 2/2019 | Wang et al. |
| 2019/0057696 A1 | 2/2019 | Ogawa |
| 2019/0065208 A1 | 2/2019 | Liu et al. |
| 2019/0095777 A1* | 3/2019 | Kim .................. G06N 3/04 |
| 2019/0102229 A1 | 4/2019 | Gupta et al. |
| 2019/0108443 A1 | 4/2019 | Dwarkanath et al. |
| 2019/0114142 A1 | 4/2019 | Yoda et al. |
| 2019/0122094 A1 | 4/2019 | Chen et al. |
| 2019/0122119 A1 | 4/2019 | Husain |
| 2019/0138372 A1 | 5/2019 | Tee |
| 2019/0147322 A1 | 5/2019 | Kim et al. |
| 2019/0156188 A1 | 5/2019 | Ono et al. |
| 2019/0164285 A1 | 5/2019 | Nye et al. |
| 2019/0180170 A1 | 6/2019 | Huang et al. |
| 2019/0199370 A1 | 6/2019 | Madduri et al. |
| 2019/0205737 A1 | 7/2019 | Bleiweiss et al. |
| 2019/0205746 A1 | 7/2019 | Nurvitadhi et al. |
| 2019/0220709 A1 | 7/2019 | Freeman et al. |
| 2019/0220734 A1 | 7/2019 | Ferdman et al. |
| 2019/0228762 A1 | 7/2019 | Wang et al. |
| 2019/0244097 A1 | 8/2019 | Notsu et al. |
| 2019/0250691 A1 | 8/2019 | Lee et al. |
| 2019/0251429 A1 | 8/2019 | Du et al. |
| 2019/0265949 A1 | 8/2019 | Ito |
| 2019/0278677 A1 | 9/2019 | Terechko et al. |
| 2019/0294968 A1 | 9/2019 | Vantrease et al. |
| 2019/0297327 A1 | 9/2019 | Mao |
| 2019/0339937 A1 | 11/2019 | Lo et al. |
| 2020/0005424 A1 | 1/2020 | Appu et al. |
| 2020/0012500 A1 | 1/2020 | Kern et al. |
| 2020/0026986 A1 | 1/2020 | Ha et al. |
| 2020/0082274 A1 | 3/2020 | Rossi et al. |
| 2020/0097799 A1 | 3/2020 | Divakar et al. |
| 2020/0117453 A1 | 4/2020 | Zhang et al. |
| 2020/0117614 A1 | 4/2020 | Zhang et al. |
| 2020/0125508 A1 | 4/2020 | Liu et al. |
| 2020/0126554 A1 | 4/2020 | Chen et al. |
| 2020/0126555 A1 | 4/2020 | Chen et al. |
| 2020/0135171 A1 | 4/2020 | Tachibana et al. |
| 2020/0142748 A1 | 5/2020 | Liu et al. |
| 2020/0159527 A1 | 5/2020 | Zhang et al. |
| 2020/0159530 A1 | 5/2020 | Zhang et al. |
| 2020/0159531 A1 | 5/2020 | Zhang et al. |
| 2020/0159532 A1 | 5/2020 | Zhang et al. |
| 2020/0159533 A1 | 5/2020 | Zhang et al. |
| 2020/0159534 A1 | 5/2020 | Li et al. |
| 2020/0160162 A1 | 5/2020 | Zhang et al. |
| 2020/0160163 A1 | 5/2020 | Liu et al. |
| 2020/0160219 A1 | 5/2020 | Zhang et al. |
| 2020/0160220 A1 | 5/2020 | Zhang et al. |
| 2020/0160221 A1 | 5/2020 | Zhang et al. |
| 2020/0160222 A1 | 5/2020 | Zhang et al. |
| 2020/0168227 A1 | 5/2020 | Chen et al. |
| 2020/0174547 A1 | 6/2020 | Fang et al. |
| 2020/0183752 A1 | 6/2020 | Liu et al. |
| 2020/0193160 A1 | 6/2020 | Lee et al. |
| 2020/0241874 A1 | 7/2020 | Chen et al. |
| 2020/0257972 A1 | 8/2020 | Miniskar et al. |
| 2020/0334041 A1 | 10/2020 | Zhang et al. |
| 2020/0334522 A1 | 10/2020 | Zhang et al. |
| 2020/0334572 A1 | 10/2020 | Zhang et al. |
| 2020/0380360 A1 | 12/2020 | Yu et al. |
| 2020/0394522 A1* | 12/2020 | Liu .................. G06N 20/00 |
| 2020/0394523 A1* | 12/2020 | Liu .................. G06F 17/18 |
| 2021/0042889 A1 | 2/2021 | Pei |
| 2021/0061028 A1 | 3/2021 | Da Deppo et al. |
| 2021/0117768 A1* | 4/2021 | Liu .................. G06N 3/08 |
| 2021/0117810 A1 | 4/2021 | Liu |
| 2021/0150767 A1* | 5/2021 | Ikai .................. H04N 19/117 |
| 2021/0182177 A1 | 6/2021 | Su et al. |
| 2021/0264270 A1* | 8/2021 | Liu .................. G06N 3/0495 |
| 2021/0286688 A1* | 9/2021 | Liu .................. G06N 3/045 |
| 2021/0334007 A1 | 10/2021 | Liu et al. |
| 2021/0334137 A1 | 10/2021 | Zhang et al. |
| 2021/0341989 A1 | 11/2021 | Chen et al. |
| 2021/0374510 A1* | 12/2021 | Liu .................. G06N 3/0495 |
| 2021/0374511 A1* | 12/2021 | Liu .................. G06N 3/08 |
| 2022/0004884 A1 | 1/2022 | Guo et al. |
| 2022/0083909 A1 | 3/2022 | Yao et al. |
| 2022/0108150 A1 | 4/2022 | Yao et al. |
| 2022/0121908 A1 | 4/2022 | Yao et al. |
| 2022/0188071 A1 | 6/2022 | Shaoli et al. |
| 2022/0222041 A1 | 7/2022 | Yao et al. |
| 2022/0230069 A1 | 7/2022 | Yugeng et al. |
| 2022/0253280 A1 | 8/2022 | Shaoli et al. |
| 2022/0261634 A1* | 8/2022 | Liu .................. G06N 3/08 |

FOREIGN PATENT DOCUMENTS

| | | |
|---|---|---|
| CN | 1851668 A | 10/2006 |
| CN | 101572829 A | 11/2009 |
| CN | 102270042 A | 12/2011 |
| CN | 102404673 A | 4/2012 |
| CN | 102684701 A | 9/2012 |
| CN | 102761509 A | 10/2012 |
| CN | 102789413 A | 11/2012 |
| CN | 102903089 A | 1/2013 |
| CN | 102981854 A | 3/2013 |
| CN | 103152673 A | 6/2013 |
| CN | 104914977 A | 9/2015 |
| CN | 105389158 A | 3/2016 |
| CN | 105426344 A | 3/2016 |
| CN | 103534664 A | 8/2016 |
| CN | 105893419 A | 8/2016 |
| CN | 105978611 A | 9/2016 |
| CN | 106156310 A | 11/2016 |
| CN | 106354568 A | 1/2017 |
| CN | 106406812 A | 2/2017 |
| CN | 106469291 A | 3/2017 |
| CN | 106485316 A | 3/2017 |
| CN | 106502626 A | 3/2017 |
| CN | 106570559 A | 4/2017 |
| CN | 106650922 A | 5/2017 |
| CN | 106814639 A | 6/2017 |
| CN | 106951587 A | 7/2017 |
| CN | 106951962 A | 7/2017 |
| CN | 106997236 A | 8/2017 |
| CN | 107003988 A | 8/2017 |
| CN | 107025629 A | 8/2017 |
| CN | 107197297 A | 9/2017 |
| CN | 107316078 A | 11/2017 |
| CN | 107329734 A | 11/2017 |
| CN | 107330515 A | 11/2017 |
| CN | 107368174 A | 11/2017 |
| CN | 107451654 A | 12/2017 |
| CN | 107451658 A | 12/2017 |
| CN | 107608715 A | 1/2018 |
| CN | 107644254 A | 1/2018 |
| CN | 107665364 A | 2/2018 |
| CN | 107688855 A | 2/2018 |
| CN | 107797913 A | 3/2018 |

(56) References Cited

FOREIGN PATENT DOCUMENTS

| | | | | |
|---|---|---|---|---|
| CN | 108053028 | A | 5/2018 | |
| CN | 104899641 | A | 7/2018 | |
| CN | 108337000 | A | 7/2018 | |
| CN | 108510067 | A | 9/2018 | |
| CN | 108717570 | A | 10/2018 | |
| CN | 109062540 | A | 12/2018 | |
| CN | 109063820 | A | 12/2018 | |
| CN | 109146057 | A | 1/2019 | |
| CN | 109213962 | A | 1/2019 | |
| CN | 109214509 | A | 1/2019 | |
| CN | 109389219 | A | 2/2019 | |
| CN | 109472353 | A | 3/2019 | |
| CN | 109800877 | A | 5/2019 | |
| CN | 109902745 | A | 6/2019 | |
| CN | 109934331 | A | 6/2019 | |
| CN | 109934761 | A | 6/2019 | |
| CN | 109993296 | A | 7/2019 | |
| CN | 110008952 | A | 7/2019 | |
| CN | 110020616 | A | 7/2019 | |
| CN | 110059733 | A | 7/2019 | |
| CN | 110163350 | A | 8/2019 | |
| CN | 110555450 | A | 12/2019 | |
| CN | 110717585 | A | 1/2020 | |
| CN | 110728352 | A | 1/2020 | |
| CN | 110780845 | A | 2/2020 | |
| CN | 110781912 | A | 2/2020 | |
| CN | 110826685 | A | 2/2020 | |
| CN | 110889503 | A * | 3/2020 | ............... G06N 3/02 |
| CN | 111027691 | A * | 4/2020 | ........... G06F 1/3234 |
| CN | 111144559 | A * | 5/2020 | ............. G06N 3/063 |
| CN | 111144564 | A * | 5/2020 | ............. G06N 3/063 |
| CN | 111652367 | A * | 9/2020 | .......... G06F 11/1476 |
| CN | 111652368 | A * | 9/2020 | ............. G06N 3/048 |
| CN | 112085151 | A * | 12/2020 | .......... G06F 18/214 |
| CN | 112085176 | A * | 12/2020 | ............. G06N 3/045 |
| CN | 112085177 | A * | 12/2020 | ........... G06N 3/0464 |
| CN | 112085182 | A * | 12/2020 | ........... G06N 3/0454 |
| CN | 112085187 | A * | 12/2020 | ........... G06N 3/0464 |
| CN | 112085188 | A * | 12/2020 | ............. G06N 3/048 |
| CN | 112085189 | A * | 12/2020 | ............. G06N 3/048 |
| CN | 112085190 | A * | 12/2020 | ............. G06N 3/048 |
| CN | 112085191 | A * | 12/2020 | ............. G06N 3/048 |
| CN | 112085192 | A * | 12/2020 | ............. G06N 3/048 |
| CN | 112085193 | A * | 12/2020 | ............. G06N 3/048 |
| EP | 0789296 | A1 | 8/1997 | |
| EP | 2703945 | A2 | 3/2014 | |
| EP | 3 001 333 | A1 | 3/2016 | |
| EP | 3106997 | A2 | 12/2016 | |
| EP | 3407268 | A1 | 11/2018 | |
| EP | 3438890 | A1 | 2/2019 | |
| EP | 3770823 | A1 * | 1/2021 | .......... G06F 11/1476 |
| EP | 3772022 | A1 * | 2/2021 | .......... G06F 11/1476 |
| EP | 3772023 | A1 * | 2/2021 | .......... G06F 11/1476 |
| JP | H0375860 | A | 3/1991 | |
| JP | H0887475 | A | 4/1996 | |
| JP | H09265379 | A | 10/1997 | |
| JP | 2009134433 | A | 8/2012 | |
| JP | 2013514570 | A | 4/2013 | |
| JP | 2014199464 | A | 10/2014 | |
| JP | 2015509183 | A | 3/2015 | |
| JP | 2015176158 | A | 10/2015 | |
| JP | 2018010618 | A | 1/2018 | |
| JP | 2018026114 | A | 2/2018 | |
| JP | 2018514872 | A | 6/2018 | |
| JP | 2019519852 | A | 7/2019 | |
| JP | 2019032833 | A | 8/2019 | |
| JP | 2022501670 | A | 1/2022 | |
| KR | 20100087845 | A | 8/2010 | |
| KR | 1020160011302 | A | 2/2016 | |
| KR | 20210011461 | A * | 2/2021 | |
| KR | 20210011462 | A * | 2/2021 | |
| KR | 20210018352 | A * | 2/2021 | |
| WO | 2008153194 | A1 | 12/2008 | |
| WO | 2012176910 | A1 | 12/2012 | |
| WO | 2014199464 | A1 | 12/2014 | |
| WO | 2016/049439 | A1 | 3/2016 | |
| WO | 2016186823 | A1 | 11/2016 | |
| WO | 2017138220 | A1 | 8/2017 | |
| WO | 2017185412 | A1 | 11/2017 | |
| WO | 2018/103736 | A1 | 6/2018 | |
| WO | 2018140294 | A1 | 8/2018 | |
| WO | 2018/159403 | A1 | 9/2018 | |
| WO | WO-2020223856 | A1 * | 11/2020 | |
| WO | WO-2020248423 | A1 * | 12/2020 | .......... G06F 11/1476 |
| WO | WO-2020248424 | A1 * | 12/2020 | .......... G06F 11/1476 |
| WO | WO-2021022903 | A1 * | 2/2021 | ............. G06N 3/044 |
| WO | WO-2021036412 | A1 * | 3/2021 | ............ G06F 18/214 |
| WO | WO-2021036890 | A1 * | 3/2021 | ........... G06N 3/0464 |
| WO | WO-2021036904 | A1 * | 3/2021 | ............ G06F 18/214 |
| WO | WO-2021036905 | A1 * | 3/2021 | ............. G06N 3/045 |
| WO | WO-2021036908 | A1 * | 3/2021 | ........... G06N 3/0464 |
| WO | WO-2021082653 | A1 * | 5/2021 | ........ G06F 9/30036 |
| WO | WO-2022111002 | A1 * | 6/2022 | |

OTHER PUBLICATIONS

Li et al., Artificial Intelligence (AI) Chip Technology Review, Nov. 8-10, 2019 [retrieved Nov. 6, 2024], 2019 International Conference on Machine Learning, Big Data and Business Intelligence (MLBDBI), pp. 114-117. https://doi.org/10.1109/MLBDBI48998.2019.00028 (Year: 2019).*

Khan, AI Chips: What They Are and Why They Matter, Apr. 2020 (retrieved Nov. 6, 2024), Center for Security and Emerging Technology, 72 pages. https://doi.org/10.51593/20190014 (Year: 2020).*

Search machine translation of WO 2020/223856 A1 to Wang et al., Data Processing Method and Device Based on Convolutional Neural Network Architecture, translated: Nov. 6, 2024, 36 pages. (Year: 2024).*

Search machine translation of CN 110889503 A to Cambricon, translated Feb. 2, 2025, 22 pages. (Year: 2025).*

Search machine translation of CN 112085182 A to Cambricon, translated Feb. 2, 2025, 32 pages. (Year: 2025).*

Search machine translation of WO 2021/022903 A1 to Liu et al.: Cambricon, translated Feb. 2, 2025, 111 pages. (Year: 2025).*

Japanese Office Action (with English Translation) dated Aug. 16, 2022, corresponding to counterpart Japanese Application No. 2021-578095; 8 total pages.

Final Office Action received for U.S. Appl. No. 16/718,981 dated Aug. 25, 2021, 53 pages.

Extended European Search Report for Application No. 19215861.6 mailed May 15, 2020, 17 pages.

Extended European Search Report for Application No. 19215862.4 mailed May 15, 2020, 17 pages.

Sumina Yamashita, et al., "A Method to create illustrate images using DCGAN", JISJ SIG Technical Report, vol. 2017-MPS-112 No. 16, Feb. 27, 2017, 8 pages.

European Patent Office, Extended European Search Report for European Application No. 19218382.0 dated Apr. 24, 2020.

Yi Yang et al., "Deploy Large-Scale Deep Neural Networks in Resource Constrained Io T Devices with Local Quantization Region", arxiv.org, Cornell University Library, 201 Olin Library Cornell University Ithaca, NY 14853, May 24, 2018, 8 pages.

Gysel Philipp et al., "Ristretto: A Framework for Empirical Study of Resource-Efficient Inference in Convolutional Neural Networks", IEEE Transactions on Neural Networks and Learning Systems, IEEE, Piscataway, NJ, USA, vol. 29, No. 11, Nov. 1, 2018 (Nov. 1, 2018), pp. 5784-5789.

Hsu Jeremy, "For sale: deep learning [News]", IEEE Spectrum, IEEE Inc. New York, US, vol. 53, No. 8, Aug. 1, 2016, pp. 12-13.

Song Mingcong et al., "In-Situ AI: Towards Autonomous and Incremental Deep Leaming for IoT Systems", 2018 IEEE International Symposium on High Performance Computer Architecture (HPCA),IEEE, Feb. 24, 2018 (Feb. 24, 2018), pp. 92-103.

Kallam Suresh et al., "Evaluating the Performance of Deep Learning Techniques on Classification Using Tensor Flow Application", 2018 International Conference on Advances in Computing and Communication Engineering (ICACCE). IEEE, Jun. 22, 2018 (Jun. 22, 2018), pp. 331-335.

(56) References Cited

OTHER PUBLICATIONS

Olariu Cristian et al., "A Cloud-Based AI Framework for Machine Learning Orchestration: A "Driving or Not-Driving" Case-Study for Self-Driving Cars", 2019 IEEE Intelligent Vehicles Symposium (IV). IEEE, Jun. 9, 2019 (Jun. 9, 2019), pp. 1715-1722.
European Patent Office, extended European search report for Application No. 19216754.2 mailed May 8, 2020.
Non-Final Office Action received for U.S. Appl. No. 16/615,255 dated Oct. 20, 2021, 46 pages.
Non-Final Office Action received for U.S. Appl. No. 16/719,035 dated Aug. 27, 2021, 53 pages.
Non-Final Office Action received for U.S. Appl. No. 16/622,541 dated Dec. 24, 2021, 37 pages.
Non-Final Office Action received for U.S. Appl. No. 16/720,655 dated Mar. 17, 2021, 36 pages.
Final Office Action received for U.S. Appl. No. 16/720,655 dated Nov. 10, 2021, 24 pages.
Extended European Search Report for EP Application No. 19214324.6 mailed Oct. 1, 2020, 11 pages.
International Searching Authority, International Search Report for PCT Application No. PCT/CN2019/093144 dated Oct. 9, 2019, 6 pages.
Non-Final Office Action received for U.S. Appl. No. 16/622,503 dated Oct. 5, 2021, 51 pages.
Non-Final Office Action received for U.S. Appl. No. 16/718,874 dated Mar. 31, 2021, 25 pages.
Notice of Allowance received for U.S. Appl. No. 16/718,874 dated Sep. 30, 2021, 20 pages.
Final Office Action received for U.S. Appl. No. 16/718,981 dated Feb. 4, 2022, 33 pages.
Final Office Action received for U.S. Appl. No. 16/719,035 dated Feb. 15, 2022, 24 pages.
Non-Final Office Action received for U.S. Appl. No. 16/720,093 dated Feb. 17, 2022, 26 pages.
Non-Final Office Action received for U.S. Appl. No. 16/720,113 dated Feb. 17, 2022, 27 pages.
Non-Final Office Action received for U.S. Appl. No. 16/706,918 dated Feb. 18, 2022, 28 pages.
Letter Restarting Period for Response (i.e. Letter re: References) received for U.S. Patent Application Serial No. Skip to Main Content U.S. Appl. No. 16/622,541 dated Feb. 22, 2022, 28 pages.
Non-Final Office Action received for U.S. Appl. No. 16/615,293 dated Feb. 24, 2022, 43 pages.
Ge, Yang, "Dynamic Thermal Management for Microprocessors", Syracuse University, Electrical Engineering and Computer Science-Dissertations, 326, Dec. 2012, 149 pages.
Moghaddam, Milad Ghorbani, "Dynamic Energy and Reliability Management in Network-on-Chip based Chip Multiprocessors", IEEE, 2017, 4 pages.
Office Action received for Japanese Application Serial No. 2020560786, filed dated Nov. 30, 2021, 03 pages.
Office Action received for Chinese Application Serial No. 201810782174.6, dated Jan. 7, 2022, 18 pages.
Office Action Received in Application 2020-566899, Dated Dec. 21, 2021, 4 pages.
Office Action Received in Application 2020-565900, Dated Dec. 14, 2021, 4 pages.
Office Action Received in Application 2020-566955, Dated Dec. 14, 2021, 5 pages.
Notice of Allowance received for U.S. Appl. No. 16/715,393 dated Mar. 22, 2022, 18 pages.
Notice of Allowance received for U.S. Appl. No. 16/718,742 dated Mar. 30, 2022, 20 pages.
Final Office Action received for U.S. Appl. No. 16/622,503 dated Mar. 14, 2022, 38 pages.
Final Office Action received for U.S. Appl. No. 16/615,255 dated Mar. 23, 2022, 28 pages.
Notice of Allowance received for U.S. Appl. No. 16/718,981 dated Apr. 26, 2022, 53 pages.
Judd, Patrick, et al. "Proteus: Exploiting numerical precision variability in deep neural networks." Proceedings of the 2016 International Conference on Supercomputing, 2016, 12 pages.
Notice of Allowance received for U.S. Appl. No. 16/720,145 dated Apr. 25, 2022, 43 pages.
Notice of Allowance received for U.S. Appl. No. 16/720,171 dated Apr. 25, 2022, 42 pages.
Non-Final Office Action received for U.S. Appl. No. 16/620,540 dated Apr. 27, 2022, 69 pages.
Iqbal, "Using Feature Weights to Improve Performance of Neural Networks," Jan. 25, 2011, https://arxiv.org/abs/1101.4918.
Rapita Systems, "Explaining the difference between Execution Times and Response Times," Sep. 16, 2010, https://www.rapitasystems.com/blog/explaining-difference-between-execution-times-and-response-times.
Cooper et al., "Redundancy Elimination Revisited ," PACT'08, Oct. 25-29, 2008, Toronto, Ontario, Canada, https://dl.acm.org/doi/10.1145/1454115.1454120.
Notice of Allowance received for U.S. Appl. No. 16/718,981 dated May 18, 2022, 39 pages.
Notice of Allowance received for U.S. Appl. No. 16/719,035 dated May 3, 2022, 39 pages.
Notice of Allowance received for U.S. Appl. No. 16/719,035 dated May 25, 2022, 17 pages.
Non-Final Office Action received for U.S. Appl. No. 16/623,837 dated May 13, 2022, 73 pages.
Sim et al.,"A Framework for Algorithm Deployment on Cloud-based Quantum Computers"; arxiv.org, Cornell University Library, 201 Olin Library Cornell University Ithaca, NY 14853, Dated Oct. 24, 2018; pp. 1-10.
European Communication dated Jun. 2, 2022, corresponding to counterpart European Application No. 18861574.4, 20 pages.
Non-Final Office Action received for U.S. Appl. No. 16/720,532 dated Jun. 16, 2022, 42 pages.
European Search Report dated May 27, 2022, corresponding to European Application No. 18920196.5, 11 pages.
Non-Final Office Action received for U.S. Appl. No. 16/614,215 dated Jul. 25, 2022, 40 pages.
Non-Final Office Action received for U.S. Appl. No. 16/714,875 dated Jul. 21, 2022, 39 pages.
Non-Final Office Action received for U.S. Appl. No. 16/715,009 dated Jul. 13, 2022, 39 pages.
Notice of Allowance received for U.S. Appl. No. 16/715,062 dated Jul. 13, 2022, 41 pages.
Notice of Allowance received for U.S. Appl. No. 16/615,255 dated Aug. 10, 2022, 30 pages.
Notice of Allowance received for U.S. Appl. No. 16/719,035 dated Aug. 16, 2022, 29 pages.
Notice of Allowance received for U.S. Appl. No. 16/615,293 dated Jul. 27, 2022, 283 pages.
Notice of Allowance received for U.S. Appl. No. 16/615,293 dated Aug. 12, 2022, 28 pages.
Final Office Action received for U.S. Appl. No. 16/720,093 dated Aug. 18, 2022, 47 pages.
Final Office Action received for U.S. Appl. No. 16/720,113 dated Aug. 18, 2022, 47 pages.
Non-Final Office Action received for U.S. Appl. No. 16/715,037 dated Aug. 2, 2022, 40 pages.
Notice of Allowance received for U.S. Appl. No. 16/715,062 dated Aug. 11, 2022, 12 pages.
Notice of Allowance received for U.S. Appl. No. 16/706,918 dated Aug. 16, 2022, 83 pages.
Lee et al., "Quantization for Rapid Deployment of Deep Neural Networks", Samsung Advanced Institute of Technology, Oct. 12, 2018, 9 pages.
Final Office Action received for U.S. Appl. No. 16/622,541 dated Aug. 31, 2022, 57 pages.
Notice of Allowance received for U.S. Appl. No. 16/715,170 dated Sep. 14, 2022, 103 pages.
Notice of Allowance received for U.S. Appl. No. 16/715,301 dated Sep. 14, 2022, 182 pages.
Office Action received for Chinese Application Serial No. 201810207915.8, dated Sep. 5, 2022, 8 pages.

(56) References Cited

OTHER PUBLICATIONS

Office Action received for Chinese Application Serial No. 202010422453.9, dated Jul. 5, 2022, 13 pages.
Office Action received for Taiwanese Application Serial No. 108102996, dated Jul. 18, 2022, 5 pages.
Non Final Office Action received for U.S. Appl. No. 16/714,974 dated Oct. 6, 2022, 47 pages.
Final Office Action received for U.S. Appl. No. 16/720,532 dated Oct. 6, 2022, 17 pages.
Non Final Office Action received for U.S. Appl. No. 16/620,540 dated Oct. 14, 2022, 61 pages.
Chen et al., "DianNao: A Small-Footprint High-Throughput Accelerator for Ubiquitous Machine-Learning," ASPLOS '14 Proceedings of the 19th international conference on Architectural support for programming languagesand operating systems, pp. 269-284.
Chen et al., "A Small-Footprint Accelerator for Large-Scale Neural Networks," ACM Transactions on Computer Systems (TOCS), vol. 33, Issue 2, May 1, 2015, Article No. 6, ACM, pp. 1-27.
Chen, Y., et al., "DaDianNao: A Machine-Learning Supercomputer," MICRO-47 Proceedings of the 47th Annual IEEE/ACM International Symposium on Microarchitecture, Dec. 13, 2014, pp. 609-622.
Luo, T., et al., "DaDianNao: A Neural Network Supercomputer," Published in: IEEE Transactions on Computers, vol. 66 , Issue: 1, May 30, 2016; pp. 73-88.
Liu, D., et al., "PuDianNao: A Polyvalent Machine Learning Accelerator," ASPLOS '15 Proceedings of the Twentieth International Conference on Architectural Support for Programming Languages and Operating Systems, Mar. 14, 2015, pp. 369-381.
Du, Z., et al., "ShiDianNao: Shifting Vision Processing Closer to the Sensor," ISCA '15 Proceedings of the 42nd Annual International Symposium on Computer Architecture, Jun. 13, 2015, pp. 92-104.
Du, Z., et al., "An Accelerator for High Efficient Vision Processing," Published in: IEEE Transactions on Computer-Aided Design of Integrated Circuits and Systems, vol. 36 , Issue: 2, Jun. 22, 2016, pp. 227-240.
Liu, S., et al., "Cambricon: An Instruction Set Architecture for Neural Networks," 2016 ACM/IEEE 43rd Annual International Symposium on Computer Architecture (ISCA), Seoul, South Korea, Jun. 18, 2016, 13 pages.
Zhang, S. et al., "Cambricon-X: An Accelerator for Sparse Neural Networks," Published in: 2016 49th Annual IEEE/ACM International Symposium on Microarchitecture (MICRO), Taipei, Taiwan, Oct. 15, 2016, 12 pages.
Chen, Y., et al., "DianNao Family: Energy-Efficient Hardware Accelerators for Machine Learning," Communications of the ACM, vol. 59 Issue 11, Oct. 28, 2016, pp. 105-112.
Vivienne Sze et al., "Efficient Processing of Deep Neural Networks: A Tutorial and Survey", arxiv.org, Cornell University Library, 201 Olin Library Cornell University Ithaca, NY 14853, Mar. 27, 2017, pp. 1-32.
Liu Shaoli et al., "Cambricon: An Instruction Set Architecture for Neural Networks", 2013 21st International Conference on Program Comprehension (ICPC); [International Symposium on Computer Architecture.(ISCA)], IEEE, US, Jun. 18, 2016 , pp. 393-405.
IBM, "PowerPC Microprocessor Family: Vector/SIMD Multimedia Extension Technology Programming Environments Manual Programming Environments Manual", Aug. 22, 2005, pp. 170-171.
Sumod Mohan, "Accuracy and Multi-Core Performance of Machine Learning Algorithms for Handwritten Character Recognition", Aug. 1, 2009 (Aug. 1, 2009), XP055673941, Retrieved from the Internet: URL: https://tigerprints.clemson.edu/cgi/viewcontent.cgi? article=1634&context=all theses retrieved on Mar. 5, 2020], 60 pages.
Anonymous, "Control unit—Wikipedia", May 8, 2017 (May 8, 2017), XP055673879, Retrieved from the Internet: URL: https://web.archive.org/web/20170508110348/https://en.wikipedia.org/ wiki/Control unit [retrieved on Mar. 5, 2020], 9 pages.
European Patent Office, Extended European Search Report for European Application No. 19212749.6 dated Mar. 18, 2020, 6 pages.
European Patent Office, Extended European Search Report for European Application No. 19212750.4 dated Mar. 18, 2020, 5 pages.
European Patent Office, Extended European Search Report for European Application No. 19212751.2 dated Mar. 18, 2020, 7 pages.
European Patent Office, Extended European Search Report for European Application No. 19212752.0 dated Mar. 18, 2020, 6 pages.
European Patent Office, Extended European Search Report for European Application No. 19214004.4 dated Mar. 18, 2020, 5 pages.
European Patent Office, Extended European Search Report for European Application No. 19213389.0 dated Mar. 18, 2020, 5 pages.
European Patent Office, Extended European Search Report for European Application No. 19212753.8 dated Mar. 18, 2020, 7 pages.
European Patent Office, Extended European Search Report for European Application No. 19212754.6 dated Mar. 18, 2020, 6 pages.
European Patent Office, Extended European Search Report for European Application No. 19212755.3 dated Mar. 18, 2020, 6 pages.
Joel Emer et al., "DNN Accelerator Architectures", CICS/MTL Tutorial, Jan. 1, 2017 (Jan. 1, 2017), XP055672691, Retrieved from the Internet: URL: https://www.rle.mit.edu/eems/wp-content/uploads/2017/031Tutorial-on- JNN-4-of-5-DNN-Accelerator-Architectures. pdf [retrieved on Mar. 2, 2020], 74 pages.
Chen Yu-Hsin et al., "Eyeriss: An Energy-Efficient Reconfigurable Accelerator for Deep Convolutional Neural getworks", IEEE Journal of Solid-State Circuits, IEEE, USA, vol. 52, No. 1, Jan. 1, 2017 (Jan. 1, 2017), pp. 127-138.
European Patent Office, Extended European Search Report for European Application No. 19212756.1 dated Mar. 18, 2020, 7 pages.
European Patent Office, Extended European Search Report for European Application No. 18906652.5 dated Mar. 18, 2020, 5 pages.
European Patent Office, Extended European Search Report for European Application No. 19212746.2 dated Mar. 18, 2020, 8 pages.
Non-Final Office Action received for U.S. Appl. No. 16/715,393 dated Jan. 22, 2021, 63 pages.
Final Office Action received for U.S. Appl. No. 16/715,393 dated Jun. 25, 2021, 25 pages.
Notice of Allowance received for U.S. Appl. No. 16/715,393 dated Nov. 8, 2021, 33 pages.
Notice of Allowance received for U.S. Appl. No. 16/715,235 dated Apr. 14, 2021, 34 pages.
Notice of Allowance received for U.S. Appl. No. 16/715,235 dated Jun. 24, 2021, 12 pages.
Notice of Allowance received for U.S. Appl. No. 16/714,899 dated Jul. 9, 2021, 44 pages.
Non-Final Office Action received for U.S. Appl. No. 16/714,915 dated Feb. 17, 2021, 31 pages.
Final Office Action received for U.S. Appl. No. 16/714,915 dated Oct. 7, 2021, 09 pages.
Non-Final Office Action received for U.S. Appl. No. 16/714,946 dated Feb. 18, 2021, 64 pages.
Final Office Action received for U.S. Appl. No. 16/714,946 dated Oct. 20, 2021, 48 pages.
Non-Final Office Action received for U.S. Appl. No. 16/715,062 dated Apr. 19, 2021, 27 pages.
Final Office Action received for U.S. Appl. No. 16/715,062 dated Nov. 1, 2021, 14 pages.
Non-Final Office Action received for U.S. Appl. No. 16/615,293 dated Mar. 16, 2021, 76 pages.
Final Office Action received for U.S. Appl. No. 16/615,293 dated Sep. 9, 2021, 104 pages.

(56) References Cited

OTHER PUBLICATIONS

Kalathingal Sajith et al., "Dynamic Inter-Thread Vectorization Architecture: Extracting OLP from TLP", 2016 28th International Symposium on Computer Architecture and High Performance Computing (SBAC-PAD), IEEE, Oct. 26, 2016, pp. 18-25.
Non-Final Office Action received for U.S. Appl. No. 16/718,742 dated Oct. 22, 2021, 98 pages.
Li et al., "Using Artificial Neural Network for Predicting Thread Partitioning in Speculative Multithreading", IEEE, 2015, pp. 823-826.
Non-Final Office Action received for U.S. Appl. No. 16/720,145 dated Oct. 22, 2021, 105 pages.
Na et al., "Speeding up Convolutional Neural Network Training with Dynamic Precision Scaling and Flexible MultiplierAccumulator", Section 2 Proposed Approach: Concept, ACM, Aug. 8-10, 2016, 6 pages.
Hanlon, Jamie, "Why is so much memory needed for deep neural networks?", URL: https://www.graphcore.ai/posts/why-is-so-much-memory-needed-for-deep-neural-networks, Jan. 31, 2017, 6 pages.
Pedro O. Domingos, et al., "An Efficient and Scalable Architecture for Neural Networks With Backpropagation Learning" Proceedings/ 2005 International Conference on Field Programmable Logic and Applications {FPL): Tampere Hall, Tampere, Finland, Jan. 1, 2005, pp. 89-94.

\* cited by examiner

DATA QUANTIZATION PROCESSING METHOD AND APPARATUS, ELECTRONIC DEVICE AND STORAGE MEDIUM

CROSS-REFERENCE TO RELATED APPLICATIONS

The present application is a national stage application of International Application PCT/CN2021/077235 filed on Feb. 22, 2021, which claims priority from Chinese patent application No. 202010111884.3 titled "DATA QUANTIZATION PROCESSING METHOD AND APPARATUS, ELECTRONIC DEVICE AND STORAGE MEDIUM", filed on Feb. 24, 2020, the disclosure of which is incorporated herein in its entirety by reference.

TECHNICAL FIELD

The present disclosure relates to the field of computer technology and in particular, to a data quantization processing method and apparatus, an electronic device, and a storage medium.

BACKGROUND

In the technical field of artificial intelligence, a neural network algorithm is a very popular machine learning algorithm approach. This has recently resulted in very good results in various fields, such as image recognition, speech recognition, natural language processing, and the like. However, as neural network complexity increases, data volume and data dimension are also constantly increasing. This poses a great challenge to data processing efficiency of a computational device, storage capacity, and access efficiency of a storage device. In related techniques, a same quantization scheme is adopted for a whole neural network. However, there may be a large difference between the different operational data of the neural network, which often leads to lower precision and affects a data operation result.

SUMMARY

Based on the situation above, and in order to solve the technical problem above, the present disclosure provides a data quantization processing method and apparatus, an electronic device, and a storage medium.

A first aspect of the present disclosure provides a data quantization processing method, which includes: according to the number of channels of an input image in a deep convolution layer, determining data to be quantized corresponding to each channel of the input image; according to the data to be quantized corresponding to each channel, determining a statistical result of the data to be quantized corresponding to each channel; for any channel, according to the statistical result of the data to be quantized corresponding to the channel, determining a quantization parameter corresponding to the channel; and quantizing the data to be quantized corresponding to each channel by using the quantization parameter corresponding to each channel to obtain quantized data corresponding to each channel of the input image, where the number of channels of the input image in the deep convolution layer is the same as the number of channels of an output image.

A second aspect of the present disclosure provides a data quantization processing apparatus, which includes: a first determining unit (e.g., a first determining circuit) configured to, according to the number of channels of an input image in a deep convolution layer, determine data to be quantized corresponding to each channel of the input image; a second determining unit (e.g., a second determining circuit) configured to, according to the data to be quantized corresponding to each channel, determine a statistical result of the data to be quantized corresponding to each channel; a third determining unit (e.g., a third determining circuit) configured to, for any channel, according to the statistical result of the data to be quantized corresponding to the channel, determine a quantization parameter corresponding to the channel; and a quantization unit (e.g., a quantization circuit) configured to, quantize the data to be quantized corresponding to each channel by using the quantization parameter corresponding to each channel to obtain quantized data corresponding to each channel of the input image, where the number of channels of the input image in the deep convolution layer is the same as the number of channels of an output image.

A third aspect of the present disclosure provides an artificial intelligence chip including the above-mentioned data quantization processing apparatus.

A fourth aspect of the present disclosure provides an electronic device including the above-mentioned artificial intelligence chip.

A fifth aspect of the present disclosure provides an electronic device including a processor, and a memory configured to store a processor-executable instruction. The processor is configured to call the instruction stored in the memory to perform the data quantization processing method as described above.

A sixth aspect of the present disclosure provides a computer-readable storage medium, on which a computer program instruction is stored, and when the computer program instruction is executed by a processor, the data quantization processing method mentioned above is implemented.

According to the number of channels of the input image in the deep convolution layer, the data to be quantized corresponding to each channel of the input image is determined; according to the data to be quantized corresponding to each channel, the statistical result of the data to be quantized corresponding to each channel is determined; for any channel, according to the statistical result of the data to be quantized corresponding to the channel, the quantization parameter corresponding to the channel is determined; and the data to be quantized corresponding to each channel is quantized by using the quantization parameter corresponding to each channel to obtain the quantized data corresponding to each channel of the input image, where the number of channels of the input image in the deep convolution layer is the same as the number of channels of the output image.

Since the number of channels of the input image in the deep convolution layer is the same as the number of channels of the output image, quantization of the input image in the deep convolution layer is performed by channels, which may improve quantization precision and guarantee accuracy and reliability of an operation result.

Other features and aspects of the present disclosure will become clear in light of the following detailed description of exemplary embodiments with reference to drawings.

BRIEF DESCRIPTION OF THE DRAWINGS

The drawings are included in the specification and constitute a part of the specification. Together with the specification, the drawings illustrate exemplary embodiments, features, and aspects of the present disclosure, and are used to explain the principles of the present disclosure.

DETAILED DESCRIPTION OF THE EMBODIMENTS

Figure 1:
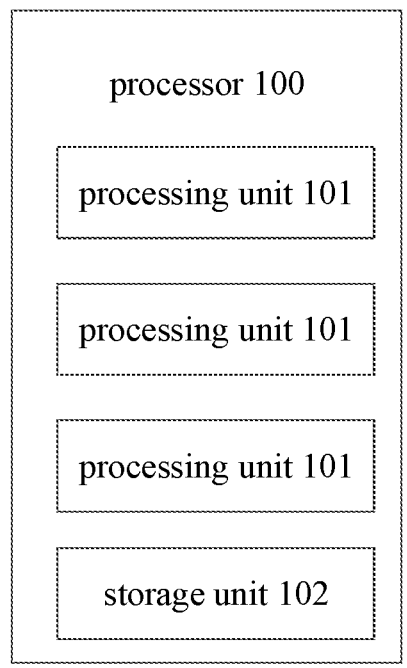
FIG. 1 is a schematic diagram of a processor of a data quantization processing method according to an embodiment of the present disclosure.

Technical solutions in embodiments of the present disclosure will be described clearly and completely hereinafter with reference to drawings in the embodiments of the present disclosure. Obviously, the embodiments to be described are merely some rather than all embodiments of the present disclosure. All other examples obtained by those skilled in the art based on the embodiments of the present disclosure without creative efforts shall fall within the protection scope of the present disclosure.

It should be understood that terms such as "first", "second", and "third" in the claims, the specification, and the drawings are used for distinguishing different objects rather than describing a specific order. It should be understood that terms "including" and "comprising" used in the specification and the claims indicate the presence of a feature, an entity, a step, an operation, an element, and/or a component, but do not exclude the existence or addition of one or more other features, entities, steps, operations, elements, components, and/or collections thereof.

It should also be understood that terms used in the specification of the present disclosure are merely intended to describe specific embodiments rather than to limit the present disclosure. As being used in the specification and the claims of the disclosure, unless the context clearly indicates otherwise, singular forms "a", "an", and "the" are intended to include plural forms. It should also be understood that a term "and/or" used in the specification and the claims refers to any and all possible combinations of one or more of relevant listed items and includes these combinations.

As being used in this specification and the claims, a term "if" may be interpreted as "when", or "once", or "in response to a determination" or "in response to a case where something is detected" depending on the context. Similarly, phrases such as "if . . . is determined" or "if [the described conditions or events] are detected" may be interpreted as "once . . . is determined", "in response to determining", "once [the described conditions or events] are detected", or "in response to detecting [the described conditions or events]".

The data quantization processing method according to embodiments of the present disclosure may be applied to a processor. The processor may be a general-purpose processor, such as a central processing unit (CPU), or an artificial intelligence processing unit (IPU) for executing an artificial intelligence operation. The artificial intelligence operation may include a machine learning operation, a neuromorphic operation, and the like. The machine learning operation may include a neural network operation, a k-means operation, a support vector machine operation, and the like. The IPU may include, for example, one or a combination of a graphics processing unit (GPU), a neural-network processing unit (NPU), a digital signal processing unit (DSP), a field-programmable gate array (FPGA), and an application specific integrated circuit (ASIC) chip. There is no restriction on a specific type of the processor in the disclosure.

In a possible embodiment, the processor involved in the disclosure may include a plurality of processing units (e.g., plurality of processing circuits). Each processing unit may separately execute various tasks assigned, such as a convolution operation task, a pooling task, a fully-connected task, and the like. There is no restriction on the processing unit and the tasks executed by the processing unit in the disclosure.

FIG. 1 is a schematic diagram of a processor of a data quantization processing method according to an embodiment of the present disclosure. As illustrated in FIG. 1, a processor 100 includes a plurality of processing units 101 and a storage unit 102 (e.g., a storage circuit). The plurality of processing units 101 are configured to execute an instruction sequence. The storage unit 102 is configured to store data, which may include a random access memory (RAM) and a register file. The plurality of processing units 101 in the processor 100 may either share some of the storage space, such as sharing some of the RAM storage space and the register file, or have their own storage spaces at the same time.

Figure 2:
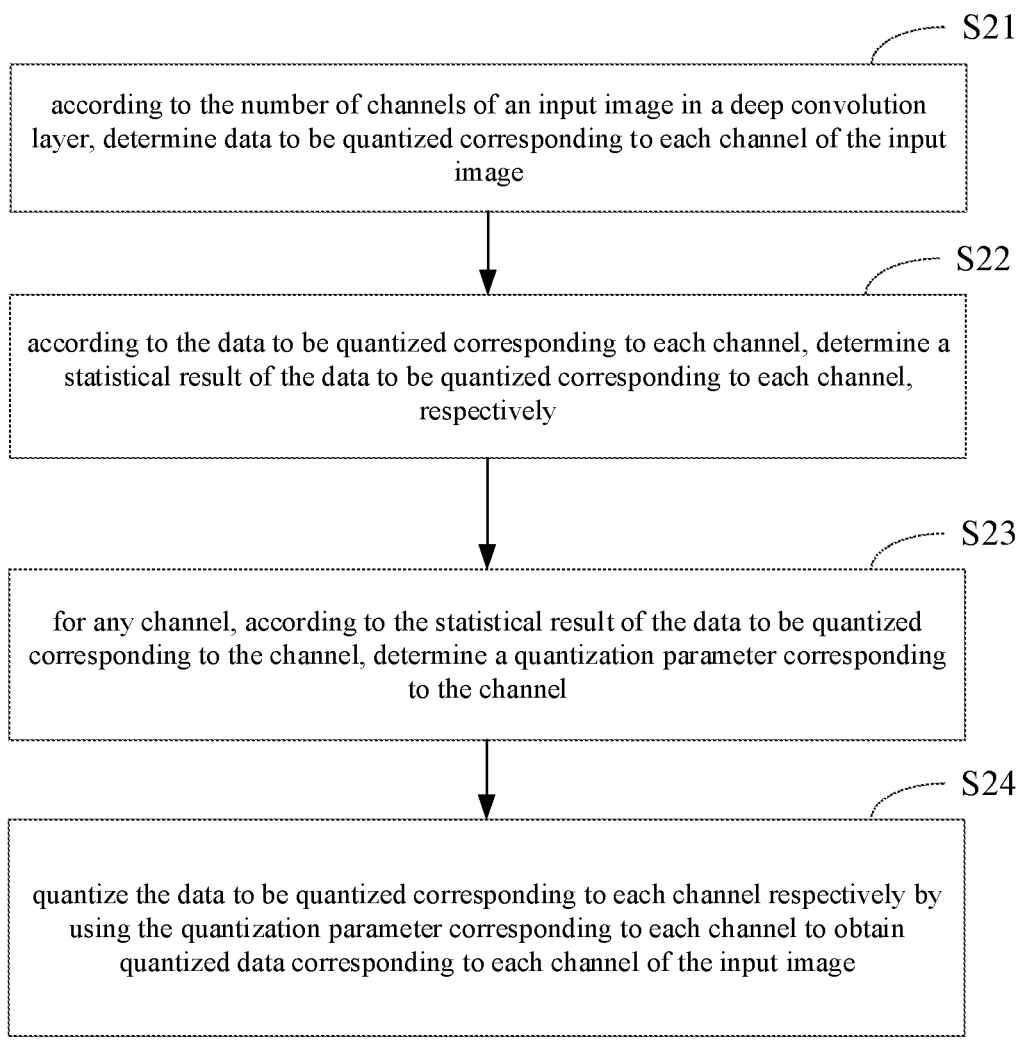
FIG. 2 is a flowchart illustrating a data quantization processing method according to an embodiment of the present disclosure.

FIG. 2 is a flowchart illustrating a data quantization processing method according to an embodiment of the present disclosure. The method may be applied to the processor 100 shown in FIG. 1. As described in FIG. 2, the method may include:

A step S21, according to the number of channels of an input image in a deep convolution layer, determining data to be quantized corresponding to each channel of the input image;

A step S22, according to the data to be quantized corresponding to each channel, determining a statistical result of the data to be quantized corresponding to each channel;

A step S23, for any channel, according to the statistical result of the data to be quantized corresponding to the channel, determining a quantization parameter corresponding to the channel; and A step S24, quantizing the data to be quantized corresponding to each channel by using the quantization parameter corresponding to each channel to obtain quantized data corresponding to each channel of the input image, where the number of channels of the input image in the deep convolution layer is the same as the number of channels of an output image, and a deep convolution network may be called a depth-wise neural network.

In a practical application, the number of channels in the input image in the deep convolution layer is the same as the number of channels in the output image. In other words, each channel of the input image does not interfere with each other during deep convolution. Therefore, when data quantization processing is performed on the input image prior to the deep convolution, in order to improve quantization precision, the data to be quantized corresponding to each channel of the input image may be determined according to the number of channels of the input image, and then the data to be quantized corresponding to each channel of the input image may be quantized separately. The data to be quantized is data represented in a high-precision data format, and the quantized data is data represented in a low-precision data format, and the precision of the data format of the data to be quantized is higher than the precision of the data format of the quantized data.

In a possible embodiment, respectively determining the statistical result of the data to be quantized corresponding to each channel according to the data to be quantized corresponding to each channel includes: for any channel, determining an absolute maximum value of the data to be quantized corresponding to the channel; and determining the absolute maximum value of the data to be quantized corresponding to the channel as the statistical result of the data to be quantized corresponding to the channel.

For example, if the number of channels of the input image is 3, an absolute maximum value of the data to be quantized corresponding to each of the three channels is determined, and then the absolute maximum value of the data to be quantized corresponding to each channel is determined as the statistical result of the data to be quantized corresponding to that channel.

In a possible embodiment, for any channel, determining the absolute maximum value of the data to be quantized corresponding to the channel includes: for any channel, determining maximum and minimum values of the data to be quantized corresponding to the channel; and according to the maximum and minimum values of the data to be quantized corresponding to the channel, determining the absolute maximum value of the data to be quantized corresponding to the channel.

For example, for each channel of the input image, maximum and minimum values of the data to be quantized corresponding to each channel are determined, and absolute values of the maximum and minimum values of the data to be quantized corresponding to each channel are taken. For any channel of the input image, the greater between the absolute values of the maximum and minimum values of the data to be quantized is determined as the absolute maximum value of the data to be quantized corresponding to the channel.

In a possible embodiment, determining the statistical result of the data to be quantized corresponding to each channel according to the data to be quantized corresponding to each channel includes: for any channel, determining maximum and minimum values of the data to be quantized corresponding to the channel; and determining one half of a distance between the maximum value and minimum value of the data to be quantized as the statistical result of the data to be quantized corresponding to the channel.

For example, for each channel of the input image, the maximum and minimum values of the data to be quantized corresponding to each channel are determined. For any channel of the input image, one half of the distance between the maximum value and minimum value of the data to be quantized corresponding to the channel is calculated, and a result of the calculation is determined as the statistical result of the data to be quantized corresponding to the channel.

After the statistical result of the data to be quantized corresponding to each channel of the input image is determined, for each channel, a quantization parameter corresponding to the channel is determined according to the statistical result of the data to be quantized corresponding to the channel.

In a possible embodiment, the quantification parameter includes a point position parameter, and for any channel, according to the statistical result of the data to be quantized corresponding to the channel, determining the quantization parameter corresponding to the channel includes: for any channel, determining a point position parameter corresponding to the channel according to the statistical result of the data to be quantized corresponding to the channel and a data bit width corresponding to the channel.

For example, the input image includes a first channel and a second channel. A point position parameter corresponding to the first channel is determined according to a statistical to result of data to be quantized corresponding to the first channel and a data bit width corresponding to the first channel. A point position parameter corresponding to the second channel is determined according to a statistical result of data to be quantized corresponding to the second channel and a data bit width corresponding to the second channel.

For each channel of the input image, data quantization processing is performed on the data to be quantized corresponding to each channel according to a point position parameter corresponding to each channel. For example, the input image includes the first channel and the second channel. The data quantization processing is performed on the data to be quantized corresponding to the first channel according to the point position parameter corresponding to the first channel. The data quantization processing is performed on the data to be quantized corresponding to the second channel according to the point position parameter corresponding to the second channel.

In an example, for any channel of the input image, according to the point position parameter s corresponding to the channel, the data to be quantized corresponding to the channel may be quantized by using a following formula (1):

$$I_x = \text{round}\left(\frac{F_x}{2^s}\right) \tag{1}$$

Where s is a point position parameter corresponding to the channel, $I_x$ is an n-bit binary representation value of data x after quantization, $F_x$ is a floating-point value of data x before quantization, and round(•) is a rounding operation. It should be noted that the rounding operation here is not only limited to round(•). Other rounding operations such as a ceiling operation, a flooring calculation, a fix operation, and the like may be used to replace the rounding operation round(•) in the formula (1). At this point, the n-bit fixed-point number can represent the maximum value A of the floating-point number as $2^s(2^{n-1}-1)$, then the n-bit fixed-point number can represent the maximum value in the number field of the data to be quantized corresponding to the channel is $-2^s(2^{n-1}-1)$, and the n-bit fixed-point number can represent the minimum value in the number field of the data to be quantized corresponding to the channel is $-2^s(2^{n-1}-1)$. According to the formula (1), for any channel of the input image, according to the point position parameter s corresponding to the channel, the data to be quantized corresponding to the channel is quantized, where the quantization interval is $2^s$.

Z is an absolute maximum of all floating-point numbers in the number field of the data to be quantized corresponding to the channel, then A is required to contain Z and Z is required be greater than $$\frac{A}{2}$$

and the following constraint of formula (2) exists:

$$2^s(2^{n-1}-1) \geq Z > 2^{s-1}(2^{n-1}-1) \quad (2)$$

Therefore, $$\log_2\left(\frac{Z}{2^{n-1}-1}\right) - 1 > s \geq \log_2\left(\frac{Z}{2^{n-1}-1}\right), s = \text{ceil}\left(\log_2\left(\frac{Z}{2^{n-1}-1}\right)\right),$$

$$\text{and } A = 2^{\text{ceil}\left(\log_2 \frac{Z}{2^{n-1}-1}\right)}(2^{n-1}-1).$$

In a possible embodiment, the quantification parameter further includes a scaling factor. For any channel, according to the statistical result of the data to be quantized corresponding to the channel, determining the quantization parameter corresponding to the channel includes: for any channel, determining a scaling factor corresponding to the channel according to the statistical result of the data to be quantized corresponding to the channel, the point position parameter corresponding to the channel, and the data bit width corresponding to the channel.

For example, the input image includes the first channel and the second channel. A scaling factor corresponding to the first channel is determined according to the statistical result of the data to be quantized corresponding to the first channel, the point position parameter corresponding to the first channel, and the data bit width corresponding to the first channel. The scaling factor corresponding to the second channel is determined according to the statistical result of the data to be quantized corresponding to the second channel, the point position parameter corresponding to the second channel, and the data bit width corresponding to the second channel.

For each channel of the input image, data quantization processing is performed on the data to be quantized corresponding to each channel, according to the point position parameter corresponding to each channel. For example, the input image includes the first channel and the second channel. Data quantization processing is performed on the data to be quantized corresponding to the first channel according to the scaling factor corresponding to the first channel. Data quantization processing is performed on the data to be quantized corresponding to the second channel according to the scaling factor corresponding to the second channel.

In an example, for any channel of the input image, the quantization parameter corresponding to the channel is a first scaling factor $f_1$. The data to be quantized corresponding to the channel may be quantized according to the first scaling factor $f_1$ corresponding to the channel by using a following formula (3):

$$I_x = \text{round}\left(\frac{F_x}{f_1}\right) \quad (3)$$

Where $f_1$ is a first scaling factor corresponding to the channel, $I_x$ is an n-bit binary representation value of data x after quantization, and $F_x$ is a floating-point value of data x before quantization and round(•) is a rounding operation. Other rounding operations such as a ceiling operation, a flooring calculation, a fix operation, and the like may be used to replace operation round(•) in the formula (3). According to the formula (3), for any channel of the input image, according to the first scaling factor corresponding to the channel, the data to be quantized corresponding to the channel is quantized, where the quantization interval is $f_1$.

In an example, the point position parameter s corresponding to the channel is a fixed known value. Let $2^s = T$, where T is a fixed value, and at this point, the n-bit fixed number may be used to represent that the maximum value A of the floating-point number is $(2^{n-1}-1) \times T$. In this case, the maximum value A depends on a data bit width n. Z is the absolute maximum value of all numbers in the number field of the data to be quantized corresponding to the channel, and then $$f_1 = \frac{Z}{2^{n-1}-1}, \text{ and } Z = (2^{n-1}-1) \times f_1.$$

The n-bit fixed-point number may represent that the maximum value in the number field of the data to be quantized corresponding to the channel is $(2^{n-1}-1) \times f_1$, and the n-bit fixed-point number may represent that the minimum value in the number field of the data to be quantized corresponding to the channel is $-(2^{n-1}-1) \times f_1$.

In an example, for example in an engineering application, $2^s \times f_2$ as a whole is treated as the first scaling factor $f_1$ corresponding to the channel, where $f_2$ is a second scaling factor corresponding to the channel. In this situation, the independent point position parameter s may be considered as not existed. Z is the absolute maximum value of all numbers in the number field of the data to be quantized corresponding to the channel, and then $$f_1 = \frac{Z}{2^{n-1}-1}, \text{ and } Z = (2^{n-1}-1) \times f_1.$$

The maximum value in the number field of the data to be quantized may be represented by the n-bit fixed-point number as $(2^{n-1}-1) \times f_1$, and the minimum value in the number field of the data to be quantized may be represented by the n-bit fixed-point number as $-(2^{n-1}-1) \times f_1$.

In an example, for any channel of the input image, the quantization parameter corresponding to the channel includes the point position parameter s and the second scaling factor $f_2$. The data to be quantized corresponding to the channel may be quantized according to the point position parameter s corresponding to the channel and the second scaling factor $f_2$ corresponding to the channel by using a following formula (4):

$$I_x = \text{round}\left(\frac{F_x}{2^s \times f_2}\right) \quad \text{formula (4)}$$

Where s is the point position parameter corresponding to the channel, $f_2$ is the second scaling factor corresponding to the channel, $I_x$ is the n-bit binary representation value of data x after quantization, $F_x$ is the floating-point value of data x before quantization, and round(•) is the rounding operation of rounding up and rounding down. It should be noted that the rounding operation is not only limited to round(•), other rounding operation methods such as the ceiling operation, the flooring calculation, the fix operation, and the like may be used to replace the rounding operation round(•) in the formula (4). According to the formula (4), for any channel of the input image, according to the point position parameter corresponding to the channel and the second scaling factor corresponding to the channel, when the data to be quantized corresponding to the channel is quantized, the quantization interval is $2^s \times f_2$.

Z is the absolute maximum value of all numbers in the number field of the data to be quantized corresponding to the channel, and at this time, according to the following formula (2), $$1 \geq \frac{Z}{2^s(2^{n-1} - 1)} > \frac{1}{2}$$

may be obtained, in other words, $$1 \geq \frac{Z}{A} > \frac{1}{2}, \text{ and } 1 \geq f_2 > \frac{1}{2}.$$

When $$f_2 = \frac{Z}{2^s(2^{n-1} - 1)} = \frac{Z}{A},$$

according to the formula (2), Z may be accurately expressed without loss. When $f_2=1$, according to the formula (4) and formula (1), $$s = \text{ceil}\left(\log_2\left(\frac{Z}{2^{n-1} - 1}\right)\right).$$

The n-bit fixed-point number may represent that the maximum value in the number field of the data to be quantized corresponding to the channel is $(2^{n-1}-1) \times 2^s \times f_2$, and the n-bit fixed-point number may represent that the minimum value in the number field of the data to be quantized corresponding to the channel is $-(2^{n-1}-1) \times 2^s \times f_2$.

Figure 3:
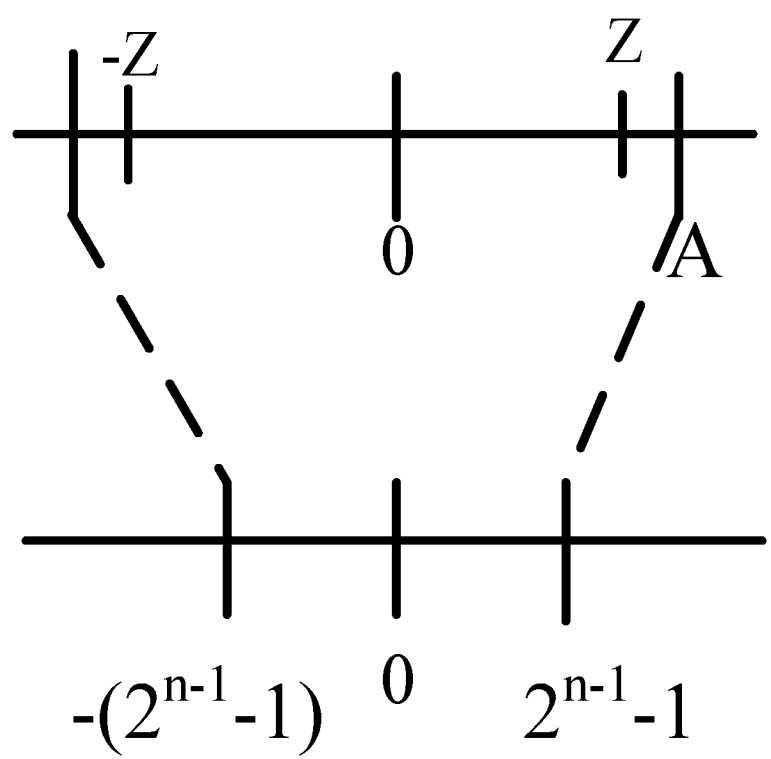
FIG. 3 is a schematic diagram of a symmetrical fixed-point number representation according to an embodiment of the present disclosure.
Figure 4:
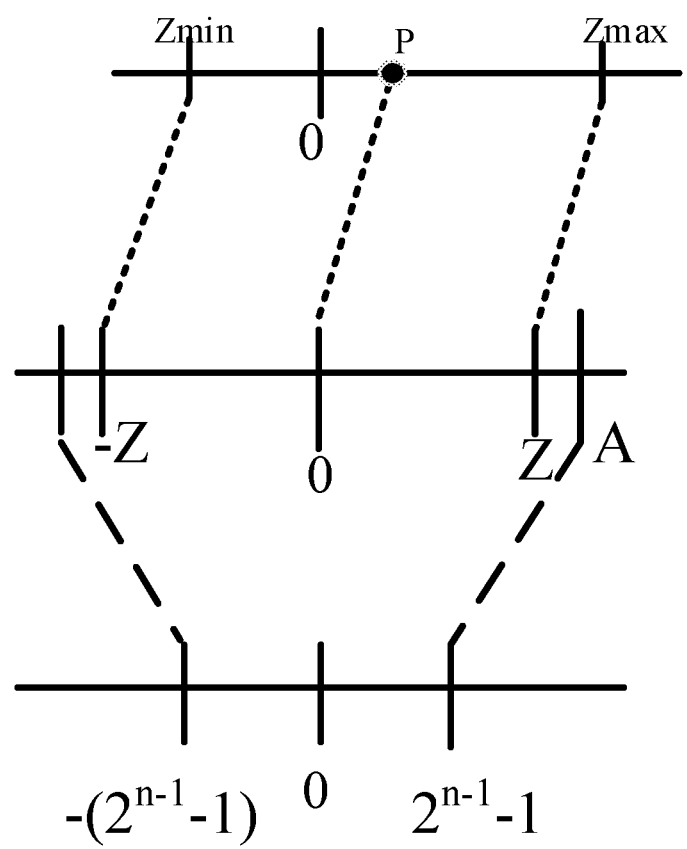
FIG. 4 is a schematic diagram of a fixed-point number representation with an introduced offset according to an embodiment of the present disclosure.

FIG. 3 is a schematic diagram of a symmetrical fixed-point number representation according to an embodiment of the present disclosure. As shown in FIG. 3, a number field of data to be quantized corresponding to any channel of an input image is distributed with "0" as a center of symmetry. Z is an absolute maximum value of all floating-point numbers in the number field of the data to be quantized corresponding to the channel. In FIG. 2, A is the maximum value of the floating-point number that may be represented by the n-bit fixed-point number, and the floating-point number A is converted to a fixed-point number $2^{n-1}-1$. To avoid an overflow, A is required to include Z. In a practical operation, floating-point number involved in a neural network operation process tends to be normally distributed in a certain interval, but may not be distributed with "0" being the center of symmetry. Therefore, the floating-point numbers being represented by fixed-point numbers may lead to the overflow. To improve this situation, an offset is introduced into the quantization parameter. FIG. 4 is a schematic diagram of a fixed-point number representation with an introduced offset according to an embodiment of the present disclosure. As shown in FIG. 4, a number field of data to be quantized corresponding to any channel of an input image is not distributed with "0" as a center of symmetry. $Z_{min}$ is a minimum value of all floating-point numbers in the number field of the data to be quantized corresponding to the channel, and $Z_{max}$ is a maximum value of all floating-point numbers in the number field of the data to be quantized corresponding to the channel. P is a center point between $Z_{min}$ and $Z_{max}$. The whole number field of the data to be quantized corresponding to the channel is shifted to make the shifted number field of the data to be quantized corresponding to the channel distributed with "0" as the center of symmetry, and an absolute maximum value in the shifted number field of the data to be quantized corresponding to the channel is Z. As shown in FIG. 4, an offset refers to a horizontal distance between the point "0" and the point "P", and the distance is called an offset O, where $$O = \frac{Z_{min} + Z_{max}}{2} \text{ and } Z = \frac{Z_{max} - Z_{min}}{2}.$$

In a possible embodiment, the quantification parameter includes the offset, and for any channel, according to the statistical result of the data to be quantized corresponding to the channel, determining the quantization parameter corresponding to the channel includes: for any channel, determining an offset corresponding to the channel according to the statistical result of the data to be quantized corresponding to the channel.

For example, the input image includes the first channel and the second channel. An offset corresponding to the first channel is determined according to the statistical result of the data to be quantized corresponding to the first channel. An offset corresponding to the second channel is determined according to the statistical result of the data to be quantized corresponding to the second channel.

For each channel of the input image, data quantization processing is performed on the data to be quantized corresponding to each channel according to an offset corresponding to each channel.

In an example, for any channel of the input image, the quantization parameter corresponding to the channel includes the point position parameter s and the offset O.

The data to be quantized corresponding to the channel may be quantized according to the point position parameter s corresponding to the channel and the offset O corresponding to the channel by using a following formula (5):

$$I_x = \text{round}\left(\frac{F_x - O}{2^s}\right), \quad \text{formula (5)}$$

where s is the point position parameter corresponding to the channel, O is the offset corresponding to the channel, $I_x$ is the n-bit binary representation value of data x after quantization, $F_x$ is the floating-point value of data x before quantization, round(•) and is the rounding operation of rounding up and rounding down. It should be noted that the rounding operation is not only limited to round(•), other rounding operation methods such as the ceiling operation, the flooring calculation, the fix operation, and the like may be used to replace the rounding operation round(•) in the formula (5). At this point, the n-bit fixed-point number may be used to represent that the maximum value A of the floating-point number is $2^s(2^{n-1}-1)$, then the n-bit fixed-point number may represent that the maximum value in the number field of the data to be quantized corresponding to the channel is $-2^s(2^{n-1}-1)+O$, and the n-bit fixed-point number may represent that the minimum value in the number field of the data to be quantized corresponding to the channel is $-2^s(2^{n-1}-1)+O$. According to the formula (5), for any channel of the input image, according to the point position parameter s corresponding to the channel and the offset O corresponding to the channel, when the data to be quantized corresponding to the channel is quantized, the quantization interval is $2^s$.

Z is the absolute maximum value of all floating-point numbers in the number field of the data to be quantized corresponding to the channel, $$Z = \frac{Z_{max} - Z_{min}}{2},$$

then A is required to include Z, and Z is required to be greater than $$\frac{A}{2}.$$

According to the formula (2), $$\log_2\left(\frac{Z}{2^{n-1}-1}\right) - 1 > s \geq \log_2\left(\frac{Z}{2^{n-1}-1}\right), \text{ then } s = \text{ceil}\left(\log_2\left(\frac{Z}{2^{n-1}-1}\right)\right),$$

$$\text{and } A = 2^{\text{ceil}\left(\log_2 \frac{Z}{2^{n-1}-1}\right)}(2^{n-1}-1).$$

In an example, for any channel of the input image, the quantization parameter corresponding to the channel includes the first scaling factor $f_1$ and the offset O. The data to be quantized corresponding to the channel may be quantized according to the first scaling factor $f_1$ corresponding to the channel and the offset O corresponding to the channel by using a following formula (6):

$$I_x = \text{round}\left(\frac{F_x - O}{f_1}\right). \qquad \text{formula (6)}$$

where $f_1$ is the first scaling factor corresponding to the channel, O is the offset corresponding to the channel, $I_x$ is the n-bit binary representation value of data x after quantization, $F_x$ is the floating-point value of data x before quantization, and round(•) is a rounding operation. It should be noted that the rounding operation is not only limited to round(•), other rounding operation methods such as the ceiling operation, the flooring calculation, the fix operation, and the like may be used to replace the rounding operation round(•) in the formula (6).

In an example, the point position parameter s corresponding to the channel is a fixed known value. Let $2^s = T$, where T is a fixed value, and at this time, the n-bit fixed number may be used to represent that the maximum value A of the floating-point number is $(2^{n-1}-1)$. In this case, the maximum value A depends on the data bit width n. Let Z be the absolute maximum value of all numbers in the number field of the data to be quantized corresponding to the channel, then $$f_1 = \frac{Z}{2^{n-1}-1}, \text{ and } Z = (2^{n-1}-1) \times f_1.$$

The n-bit fixed-point number may represent that the maximum value in the number field of the data to be quantized corresponding to this channel is $(2^{n-1}-1) \times f_1 + O$, and the n-bit fixed-point number may represent that the minimum value in the number field of the data to be quantized corresponding to this channel is $-(2^{n-1}-1) \times f_1 + O$.

In an example, for example in an engineering application, $2^s \times f_2$ as a whole is treated as the first scaling factor $f_1$ corresponding to the channel, where $f_2$ is the second scaling factor corresponding to the channel. In this situation, the independent point position parameter s may be considered as not existed. Let Z be the absolute maximum value of all numbers in the number field of the data to be quantized corresponding to the channel, then $$f_1 = \frac{Z}{2^{n-1}-1}, \text{ and } Z = (2^{n-1}-1) \times f_1.$$

The n-bit fixed-point number may represent that the maximum value in the number field of the data to be quantized corresponding to this channel is $(2^{n-1}-1) \times f_1 + O$ and the n-bit fixed-point number may represent that the minimum value in the number field of the data to be quantized is $-(2^{n-1}-1) \times f_1 + O$.

In an example, for any channel of the input image, the quantization parameter corresponding to the channel includes the point position parameter s, the first scaling factor $f_1$, and the offset O. The data to be quantized corresponding to the channel may be quantized according to the point position parameter s, the first scaling factor $f_1$, and the offset O corresponding to the channel by using a following formula (7):

$$I_x = \text{round}\left(\frac{F_x - O}{2^s \times f_2}\right) \qquad \text{formula (7)}$$

where s is the point position parameter corresponding to the channel, $f_1$ is the first scaling factor corresponding to the channel, O is the offset corresponding to the channel, $I_x$ is the n-bit binary representation value of data x after quantization, and $F_x$ is the floating-point value of data x before quantization, round(•) and is the rounding operation of rounding up and rounding down. It should be noted that the rounding operation is not only limited to round(•). Other rounding operation methods such as the ceiling operation, the flooring calculation, the fix operation, and the like may be used to replace the rounding operation round(•) in the formula (7). At this point, the n-bit fixed-point number may be used to represent that the maximum value A of the floating-point number is $2^s(2^{n-1}-1)$. According to the formula (7), for any channel of the input image, according to the point position parameter s corresponding to the channel, the first scaling factor $f_1$ corresponding to the channel, and the offset O corresponding to the channel, when the data to be quantized corresponding to the channel is quantized, the quantization interval is $2^s \times f_2$.

Z is the absolute maximum value of all floating-point numbers in the number field of the data to be quantized corresponding to the channel, and at this time, according to the following formula (2), $$1 \geq \frac{Z}{2^s(2^{n-1}-1)} > \frac{1}{2}$$

may be obtained, in other words, $$1 \geq \frac{Z}{A} > \frac{1}{2}, \text{ and } 1 \geq f_2 > \frac{1}{2}.$$

When $$f_2 = \frac{Z}{2^s(2^{n-1}-1)} = \frac{Z}{A},$$

according to the formula (2), Z may be accurately expressed without loss. When $$f_2 = 1, s = \text{ceil}\left(\log_2\left(\frac{Z_{max} - Z_{min}}{2(2^{n-1}-1)}\right)\right).$$

The n-bit fixed-point number may represent that the maximum value in the number field of the data to be quantized corresponding to the channel is $(2^{n-1}-1) \times 2^s \times f_2 + O$, and the n-bit fixed-point number may represent that the minimum value in the number field of the data to be quantized corresponding to the channel is $(2^{n-1}-1) \times 2^s \times f_2 + O$.

In a possible embodiment, for any channel, the data bit width corresponding to the channel is a preset value.

According to formulas (1) through (7), for any channel of the input image, both the point position parameter corresponding to the channel and the scaling factor corresponding to the channel are related to the data bit width corresponding to the channel. Different data bit widths may lead to different point position parameters and different scaling factors, which may affect quantization precision. Quantization is a process of converting a high-precision number usually represented by 32 bits or 64 bits into a fixed-point number that occupies less memory space, which may cause certain loss in precision. In the process of training or fine-tuning, within a certain range of iteration times, quantization by using the same bit width may have little effect on the overall precision of a neural network operation. If a count of iterations exceeds a certain number, quantization by using the same data bit width may not meet the training or fine-tuning requirements on precision, which requires adjustment of the data bit width n with the training or the fine-tuning process. Simply, the data bit width n corresponding to the channel may be artificially set to a preset value. Within different ranges of iterations times, a preset bit width n corresponding to the channel may be called.

In a possible embodiment, the method further includes: for any channel, adjusting the data bit width corresponding to the channel according to a quantization error of the data bit width corresponding to the channel, so as to determine the quantization parameter corresponding to the channel by using an adjusted data bit width, where the quantization error is determined based on the quantized data corresponding to the channel and the data to be quantized corresponding to the channel.

In a possible embodiment, adjusting the data bit width corresponding to the channel according to the quantization error of the data bit width corresponding to the channel includes: comparing the quantization error with a threshold, and adjusting the data bit width corresponding to the channel according to a comparison result.

In a possible embodiment, the threshold includes a first threshold and a second threshold, and comparing the quantization error with the threshold and adjusting the data bit width corresponding to the channel according to the comparison result include: in the case that the quantization error is greater than or equal to the first threshold, increasing the data bit width corresponding to the channel; in the case that the quantization error is less than or equal to the second threshold, decreasing the data bit width corresponding to the channel; and in the case that the quantization error is between the first threshold and the second threshold, keeping the data bit width corresponding to the channel unchanged. In these embodiments, the first threshold and the second threshold may be empirical values or variable hyperparameters. Conventional optimization methods for hyperparameters are suitable for both the first threshold and the second threshold, which will not be described further.

It should be emphasized that, for any channel of the input image, the data bit width corresponding to the channel may be adjusted according to a fixed bit stride, or according to a variable adjustment stride based on a difference between the quantization error and an error threshold. Finally, the data bit width corresponding to any channel of the input image may be adjusted to be longer or shorter according to actual needs in the process of deep convolution network operation, and therefore, fixed-point operation speed may be greatly increased within the range of precision, thus improving resource utilization of an artificial intelligence processor chip.

According to the number of channels of the input image in a deep convolution layer, the data to be quantized corresponding to each channel of the input image is determined; according to the data to be quantized corresponding to each channel, the statistical result of the data to be quantized corresponding to each channel is determined; for any channel, according to the statistical result of the data to be quantized corresponding to the channel, the quantization parameter corresponding to the channel is determined; and the data to be quantized corresponding to each channel is quantized by using the quantization parameter corresponding to each channel to obtain the quantized data corresponding to each channel of the input image, where the number of channels of the input image in the deep convolution layer is the same as the number of channels of an output image. Since the number of channels of the input image in the deep convolution layer is the same as the number of channels of the output image, quantization of the input image in the deep convolution layer is performed by channels, which may improve quantization precision and guarantee accuracy and reliability of an operation result.

It should be noted that, the foregoing embodiments of method, for the sake of conciseness, are all described as a series of action combinations, but those skilled in the art should know that since according to the present disclosure, steps may be performed in a different order or simultaneously, the disclosure is not limited by the described order of action. Secondly, those skilled in the art should also understand that the embodiments described in the specification are all optional, and the actions and modules involved are not necessarily required for this disclosure.

Further, it should be explained that though the steps in the flowchart of FIG. 2 are shown sequentially as indicated by arrows, yet these steps may not necessarily be performed according to the order indicated by the arrows. Unless clearly stated herein, the order for performing these steps is not strictly restricted. These steps may be performed in a different order. Additionally, at least part of the steps shown in FIG. 2 may include a plurality of sub-steps or a plurality of stages. These sub-steps or stages may not necessarily be performed and completed at the same time, instead, these sub-steps or stages may be performed at different time. These sub-steps or stages may not necessarily be performed sequentially either, instead, these sub-steps or stages may be performed in turn or alternately with at least part of other steps, or sub-steps of other steps, or stages.

Figure 5:
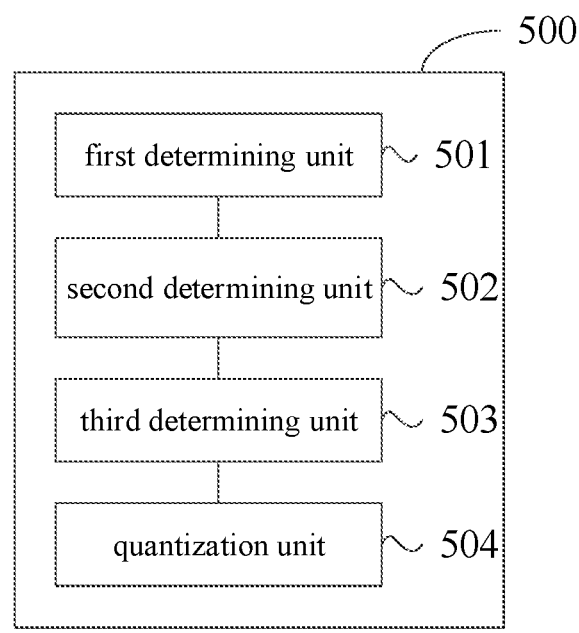
FIG. 5 is a structural block diagram of a data quantization processing apparatus according to an embodiment of the present disclosure.

FIG. 5 is a structural block diagram of a data quantization processing apparatus according to an embodiment of the present disclosure. As described in FIG. 5, an apparatus 500 includes:

a first determining unit 501 configured to, according to the number of channels of an input image in a deep convolution layer, determine data to be quantized corresponding to each channel of the input image;

a second determining unit 502 configured to, according to the data to be quantized corresponding to each channel, determine a statistical result of the data to be quantized corresponding to each channel;

a third determining unit 503 configured to, for any channel, according to the statistical result of the data to be quantized corresponding to the channel, determine a quantization parameter corresponding to the channel; and a quantization unit 504 configured to quantize the data to be quantized corresponding to each channel by using the quantization parameter corresponding to each channel to obtain quantized data corresponding to each channel of the input image, where the number of channels of the input image in the deep convolution layer is the same as the number of channels of an output image.

In a possible embodiment, the quantization parameter may include a point position parameter.

The third determining unit 503 is configured to: for any channel, determine a point position parameter corresponding to the channel according to the statistical result of the data to be quantized corresponding to the channel and a data bit width corresponding to the channel.

In a possible embodiment, the quantization parameter may further include a scaling factor.

The third determining unit 503 is configured to: for any channel, determine a scaling factor corresponding to the channel according to the statistical result of the data to be quantized corresponding to the channel, the point position parameter corresponding to the channel, and the data bit width corresponding to the channel.

In a possible embodiment, the quantization parameter may include an offset.

The third determining unit 503 is configured to: according to the statistical result of the data to be quantized corresponding to the channel, determine an offset corresponding to the channel.

In a possible embodiment, the second determining unit 502 may include:

a first determining sub-unit (e.g., a first determining sub-circuit) configured to, for any channel, determine an absolute maximum value of the data to be quantized corresponding to the channel; and a second determining sub-unit (e.g., a first determining sub-circuit) configured to determine the absolute maximum value of the data to be quantized corresponding to the channel as the statistical result of the data to be quantized corresponding to the channel.

In a possible embodiment, the first determining sub-unit is configured to:

for any channel, determine maximum and minimum values of the data to be quantized corresponding to the channel; and determine the absolute maximum value of the data to be quantized corresponding to the channel according to the maximum and minimum values of the data to be quantized corresponding to the channel.

In a possible embodiment, for any channel, the data bit width corresponding to the channel is a preset value.

In a possible embodiment, the apparatus 500 may further include:

a data bit width adjustment unit (e.g., data bit width adjustment circuit) configured to, for any channel, adjust the data bit width corresponding to the channel according to a quantization error of the data bit width corresponding to the channel, so as to determine the quantization parameter corresponding to the channel by using an adjusted data bit width, where the quantization error is determined based on the quantized data corresponding to the channel and the data to be quantized corresponding to the channel.

In a possible embodiment, the data bit width adjustment unit is configured to:

compare the quantization error with a threshold, and adjust the data bit width corresponding to the channel according to a comparison result, where the threshold includes a first threshold and a second threshold.

The data bit width adjustment unit is configured to:

increase the data bit width corresponding to the channel when the quantization error is greater than or equal to the first threshold;

decrease the data bit width corresponding to the channel when the quantization error is less than or equal to the second threshold; and keep the data bit width corresponding to the channel unchanged when the quantization error is between the first threshold and the second threshold.

The data quantization processing apparatus 500 provided in the present disclosure is capable of implementing all steps in the method embodiment shown in FIG. 2 and achieving the same technical effect, which will not be repeated here.

It should be understood that the foregoing apparatus embodiments are only illustrative, and the apparatus of the present disclosure may also be implemented in other ways. For example, a division of units/modules/circuits in the foregoing embodiment is only a logical function division, and there may be other division methods in an actual implementation. For example, a plurality of units, modules, or components may be combined or integrated into another system, or some features may be omitted or not implemented.

In addition, unless otherwise specified, the functional units/modules in various embodiments of the present disclosure may be integrated into one unit/module. Alternatively, each unit/module may exist alone physically. Alternatively, two or more units/modules may be integrated together. The above-mentioned integrated unit/module may be implemented in the form of hardware or in the form of a software program module.

When the above-mentioned integrated unit/module/circuit is implemented in the form of hardware, the hardware may be a digital circuit, an analog circuit, and the like. A physical implementation of a hardware structure may include, but is not limited to, a transistor, a memristor, and the like. Unless otherwise specified, the artificial intelligence processor may be any appropriate hardware processor, such as a CPU, a GPU, an FPGA, a DSP, an ASIC, and the like. Unless otherwise specified, a storage unit (e.g., a storage unit) may be any suitable magnetic storage medium or magneto-optical storage medium, such as an RRAM (Resistive Random Access Memory), a DRAM (Dynamic Random Access Memory), an SRAM (Static Random-Access Memory), an EDRAM (Enhanced Dynamic Random Access Memory), an HBM (High-Bandwidth Memory), or an HMC (Hybrid Memory Cube), or the like.

If the integrated unit/module/circuit is implemented in the form of the software program module and sold or used as an independent product, the integrated unit/module/circuit may be stored in a computer-readable memory. Based on such understanding, the essence of the technical solution of the present disclosure, or a part of the present disclosure that contributes to the prior art, or all or part of the technical solution, may all or partly be embodied in the form of a software product that is stored in a memory. The software product includes several instructions to be used to enable a computer device (which may be a personal computer, a server, or a network device, and the like) to perform all or part of steps of the method described in the embodiments of the present disclosure. The foregoing memory includes: an USB, a flash drive, an ROM (read-only memory), an RAM (random access memory), a mobile hard disk, a magnetic disk, or an optical disc, and other media that may store a program code.

In a possible embodiment, the present disclosure provides an artificial intelligence chip including the above-mentioned data quantization processing apparatus.

In a possible embodiment, the present disclosure also provides a board card including a storage component, an interface device, a control component, and the above-mentioned artificial intelligence chip. The artificial intelligence chip is connected to the storage component, the control component, and the interface device, respectively; the storage component is configured to store data; the interface device is configured to implement data transfer between the artificial intelligence chip and an external device; and the control component is configured to monitor a state of the artificial intelligence chip.

Figure 6:
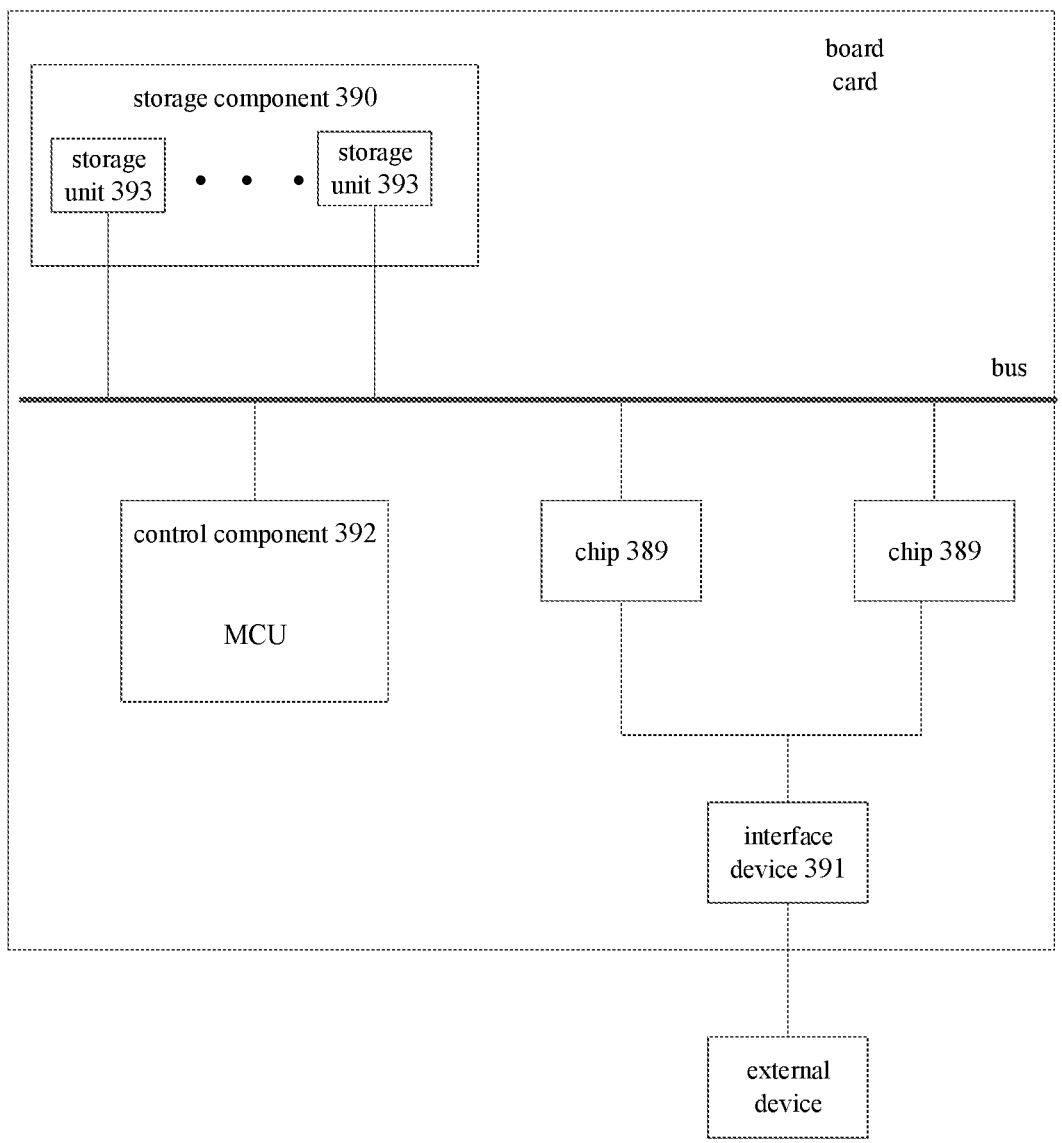
FIG. 6 is a structural block diagram of a board card according to an embodiment of the present disclosure.

FIG. 6 is a structural block diagram of a board card according to an embodiment of the present disclosure. Referring to FIG. 6, in addition to the chip 389 above, the board card may further include other matching components. The matching components include but are not limited to a storage component 390, an interface device 391, and a control component 392.

The storage component 390 is connected to the artificial intelligence chip through a bus, and is configured to store data. The storage component may include a plurality of groups of storage units 393 (e.g., a plurality of groups of storage circuits). Each group of the storage units is connected to the artificial intelligence chip through the bus. It may be understood that each group of the storage units may be a DDR SDRAM (Double Data Rate Synchronous Dynamic Random Access Memory).

The DDR may double the speed of the SDRAM without increasing clock frequency. The DDR allows data to be read on rising and falling edges of a clock pulse. A speed of the DDR is twice that of a standard SDRAM. In an embodiment, a storage apparatus may include 4 groups of the storage units. Each group of the storage units may include a plurality of DDR4 particles (chips). In an embodiment, four 72-bit DDR4 controllers may be arranged inside the artificial intelligence chip, where 64 bits of each 72-bit DDR4 controller are used for data transfer and 8 bits are used for ECC (Error Correcting Code) check-out. It may be understood that when each group of the storage units adopts DDR4-3200 particles, a theoretical bandwidth of data transfer may reach 25600 MB/s.

In an embodiment, each group of the storage units may include a plurality of DDR SDRAMs arranged in parallel. The DDR may transfer data twice per clock cycle. A DDR controller may be arranged inside the chip for controlling the data transfer and data storage of each storage unit.

The interface device may be electrically connected to the artificial intelligence chip. The interface device is configured to realize data transfer between the artificial intelligence chip and an external device (such as a server or a computer). In an embodiment, the interface device may be a standard PCIE (Peripheral Component Interconnect Express) interface. For instance, data to be processed may be transferred from the server through the standard PCIE interface to the chip, thereby realizing data transfer. Preferably, when a PCIE 3.0×16 interface is adopted for transferring, the theoretical bandwidth may reach 16000 MB/s. In another embodiment, the interface device may also be other interfaces. The present disclosure does not restrict specific forms of other interfaces as long as an interface unit may realize a transferring function. In addition, a computation result of the artificial intelligence chip may still be transferred by the interface device to the external device (such as the server).

The control component is electrically connected to the artificial intelligence chip. The control component is configured to monitor a state of the artificial intelligence chip. The artificial intelligence chip and the control component may be electrically connected through an SPI (Serial Peripheral Interface) interface. The control component may include an MCU (Micro Controller Unit). If the artificial intelligence chip includes a plurality of processing chips, a plurality of processing cores, or a plurality of processing circuits, the chip is capable of driving a plurality of loads. In this case, the artificial intelligence chip may be in different working states such as a multi-load state and a light-load state. The working states of the plurality of processing chips, the plurality of processing cores, or a plurality of processing circuits may be regulated and controlled by the control device.

In a possible implementation, an electronic device is provided. The electronic device includes the artificial intelligence chip. The electronic device includes a data processing device, a robot, a computer, a printer, a scanner, a tablet, a smart terminal, a mobile phone, a traffic recorder, a navigator, a sensor, a webcam, a server, a cloud-based server, a camera, a video camera, a projector, a watch, a headphone, a mobile storage, a wearable device, a vehicle, a household appliance, and/or a medical device. The vehicle includes an airplane, a ship, and/or a car; the household appliance may include a television, an air conditioner, a microwave oven, a refrigerator, an electric rice cooker, a humidifier, a washing machine, an electric lamp, a gas cooker, and a range hood; and the medical device may include a nuclear magnetic resonance spectrometer, a B-ultrasonic scanner, and/or an electrocardiograph.

The present disclosure also provides a computer-readable storage medium, on which a computer program instruction is stored, and when the computer program instruction is executed by the processor, the data quantization processing method mentioned above is implemented. The computer-readable storage medium may be a non-volatile computer-readable storage medium.

The present disclosure also provides an electronic device including a processor, and a memory configured to store a processor-executable instruction. The processor is configured to call the instruction stored in the memory to perform the data quantization processing method as described above.

The electronic device may be provided as a terminal, the server or other forms of device.

In the foregoing embodiments, the description of each implementation has its own emphasis. For the parts that are not described in detail in an embodiment, reference may be made to related descriptions in other embodiments. The technical features of the above-described embodiments may be arbitrarily combined, and not all possible combinations of the technical features of the above-described embodiments have been described to make the description concise. However, as long as there is no contradiction in the combinations of the technical features, the combinations of the technical features shall fall within the scope of the specification.

The foregoing may be better understood according to the following articles:

A1. A data quantization processing method, including:
according to the number of channels of an input image in a deep convolution layer, determining data to be quantized corresponding to each channel of the input image;
according to the data to be quantized corresponding to each channel, determining a statistical result of the data to be quantized corresponding to each channel;
for any channel, according to the statistical result of the data to be quantized corresponding to the channel, determining a quantization parameter corresponding to the channel; and
quantizing the data to be quantized corresponding to each channel by using the quantization parameter corresponding to each channel to obtain quantized data corresponding to each channel of the input image,
where the number of channels of the input image in the deep convolution layer is the same as the number of channels of an output image.

A2. The method of A1, wherein the quantization parameter includes a point position parameter; and
for any channel, according to the statistical result of the data to be quantized corresponding to the channel, determining the quantization parameter corresponding to the channel includes:
for any channel, determining a point position parameter corresponding to the channel according to the statistical result of the data to be quantized corresponding to the channel and a data bit width corresponding to the channel.

A3. The method of A2, wherein the quantization parameter further includes a scaling factor; and
for any channel, according to the statistical result of the data to be quantized corresponding to the channel, determining the quantization parameter corresponding to the channel includes:
for any channel, determining a scaling factor corresponding to the channel according to the statistical result of the data to be quantized corresponding to the channel, the point position parameter corresponding to the channel, and the data bit width corresponding to the channel.

A4. The method of A1, wherein the quantization parameter includes an offset; and
for any channel, according to the statistical result of the data to be quantized corresponding to the channel, determining the quantization parameter corresponding to the channel includes:
for any channel, according to the statistical result of the data to be quantized corresponding to the channel, determining an offset corresponding to the channel.

A5. The method of A1-A4, wherein according to the data to be quantized corresponding to each channel, determining the statistical result of the data to be quantized corresponding to each channel includes:
for any channel, determining an absolute maximum value of the data to be quantized corresponding to the channel; and
determining the absolute maximum value of the data to be quantized corresponding to the channel as the statistical result of the data to be quantized corresponding to the channel.

A6. The method of A5, wherein for any channel, determining the absolute maximum value of the data to be quantized corresponding to the channel includes:
for any channel, determining maximum and minimum values of the data to be quantized corresponding to the channel; and
determining the absolute maximum value of the data to be quantized corresponding to the channel according to the maximum and minimum values of the data to be quantized corresponding to the channel.

A7. The method of A2 or A3, wherein for any channel, the data bit width corresponding to the channel is a preset value.

A8. The method of A2 or A3, further including:
for any channel, adjusting the data bit width corresponding to the channel according to a quantization error of the data bit width corresponding to the channel, so as to determine the quantization parameter corresponding to the channel by using an adjusted data bit width, wherein the quantization error is determined based on the quantized data corresponding to the channel and the data to be quantized corresponding to the channel.

A9. The method of A8, wherein adjusting the data bit width corresponding to the channel according to the quantization error of the data bit width corresponding to the channel includes:
comparing the quantization error with a threshold, and adjusting the data bit width corresponding to the channel according to a comparison result.

A10. The method of A9, wherein the threshold includes a first threshold and a second threshold; and
comparing the quantization error with the threshold and adjusting the data bit width corresponding to the channel according to the comparison result include:
increasing the data bit width corresponding to the channel when the quantization error is greater than or equal to the first threshold;
decreasing the data bit width corresponding to the channel when the quantization error is less than or equal to the second threshold; and
keeping the data bit width corresponding to the channel unchanged when the quantization error is between the first threshold and the second threshold.

A11. A data quantization processing apparatus, including:
a first determining unit configured to, according to the number of channels of an input image in a deep convolution layer, determine data to be quantized corresponding to each channel of the input image;
a second determining unit configured to, according to the data to be quantized corresponding to each channel, determine a statistical result of the data to be quantized corresponding to each channel;
a third determining unit configured to, for any channel, according to the statistical result of the data to be quantized corresponding to the channel, determine a quantization parameter corresponding to the channel; and a quantization unit configured to quantize the data to be quantized corresponding to each channel by using the quantization parameter corresponding to each channel to obtain quantized data corresponding to each channel of the input image, where the number of channels of the input image in the deep convolution layer is the same as the number of channels of an output image.

A12. An artificial intelligence chip including the data quantization processing apparatus of A11.

A13. An electronic device including the artificial intelligence chip of A12.

A14. An electronic device, including:

a processor, and a memory configured to store a processor-executable instruction, where the processor is configured to call the instructions stored in the memory to perform the method of any one of A1-A10.

A15. A computer-readable storage medium, on which a computer program instruction is stored, wherein the method of any one of A1-A10 is implemented when the computer program instruction is executed by a processor.

The embodiments of the present disclosure have been described in detail above. Specific examples have been used in the specification to explain the principles and implementations of the present disclosure. The descriptions of the above embodiments are only used to facilitate understanding of the method and core ideas of the present disclosure. At the same time, persons of ordinary skill in the art may change or transform the implementation and application scope according to the ideas of the present application. The changes and transformations shall all fall within the protection scope of the present disclosure. In summary, the content of this specification should not be construed as a limitation on the present disclosure.

What is claimed is:

1. A data quantization processing method comprising:

determining data to be quantized corresponding to each channel of an input image according to a quantity of channels of the input image in a deep convolution layer;

according to the data to be quantized corresponding to each channel, determining a statistical result of the data to be quantized corresponding to each channel;

for each channel, according to the statistical result of the data to be quantized corresponding to the channel, determining a quantization parameter corresponding to each channel; and quantizing the data to be quantized corresponding to each channel by using the quantization parameter corresponding to each channel to obtain quantized data corresponding to each channel of the input image, wherein the number of channels of the input image in the deep convolution layer is the same as the number of channels of an output image;

wherein the quantization parameter includes a point position parameter for each channel; and the method further comprises:

for each channel, determining the point position parameter corresponding to the channel according to the statistical result of the data to be quantized corresponding to the channel and a data bit width corresponding to the channel; and for each channel, adjusting the data bit width corresponding to the channel according to a quantization error of the data bit width corresponding to the channel, so as to determine the quantization parameter corresponding to the channel by using an adjusted data bit width, wherein the quantization error is determined based on the quantized data corresponding to the channel and the data to be quantized corresponding to the channel.

2. The method of claim 1, wherein the quantization parameter further includes a scaling factor for each channel; and wherein for each channel, according to the statistical result of the data to be quantized corresponding to the channel, the determining of the quantization parameter corresponding to the channel includes:

for each channel, determining the scaling factor corresponding to the channel according to the statistical result of the data to be quantized corresponding to the channel, the point position parameter corresponding to the channel, and the data bit width corresponding to the channel.

3. The method of claim 1, wherein the quantization parameter includes an offset for each channel; and the method further comprises:

for each channel, according to the statistical result of the data to be quantized corresponding to the channel, determining the quantization parameter corresponding to the channel includes:

for each channel, according to the statistical result of the data to be quantized corresponding to the channel, determining the offset corresponding to the channel.

4. The method of claim 1, wherein according to the data to be quantized corresponding to each channel, the determining of the statistical result of the data to be quantized corresponding to each channel includes:

for each channel, determining an absolute maximum value of the data to be quantized corresponding to the channel; and determining the absolute maximum value of the data to be quantized corresponding to the channel as the statistical result of the data to be quantized corresponding to the channel.

5. The method of claim 4, wherein for each channel, the determining of the absolute maximum value of the data to be quantized corresponding to the channel includes:

for each channel, determining a maximum value and a minimum value of the data to be quantized corresponding to the channel; and determining the absolute maximum value of the data to be quantized corresponding to the channel according to the maximum value and the minimum value of the data to be quantized corresponding to the channel.

6. The method of claim 1, wherein for each channel, the data bit width corresponding to the channel is a preset value.

7. The method of claim 1, wherein the adjusting of the data bit width corresponding to the channel according to the quantization error of the data bit width corresponding to the channel includes:

comparing the quantization error with a threshold, and adjusting the data bit width corresponding to the channel according to a comparison result.

8. The method of claim 7, wherein the threshold includes a first threshold and a second threshold; and wherein the comparing of the quantization error with the threshold and the adjusting of the data bit width corresponding to the channel according to the comparison result include:

increasing the data bit width corresponding to the channel when the quantization error is greater than or equal to the first threshold;

decreasing the data bit width corresponding to the channel when the quantization error is less than or equal to the second threshold; and keeping the data bit width corresponding to the channel unchanged when the quantization error is between the first threshold and the second threshold.

9. An electronic device, comprising:
a processor; and
a memory configured to store a processor-executable instruction,
wherein the processor is configured to call the instruction stored in the memory to perform the method of claim 1.

10. A non-transitory computer-readable storage medium, on which a computer program instruction is stored, wherein the method of claim 1 is implemented when the computer program instruction is executed by a processor.

11. The non-transitory computer-readable storage medium of claim 10, wherein the quantization parameter further includes a scaling factor for each channel, and wherein
for each channel, according to the statistical result of the data to be quantized corresponding to the channel, the determining of the quantization parameter corresponding to the channel includes:
for each channel, determining the scaling factor corresponding to the channel according to the statistical result of the data to be quantized corresponding to the channel, the point position parameter corresponding to the channel, and the data bit width corresponding to the channel.

12. The non-transitory computer-readable storage medium of claim 10, wherein the quantization parameter includes an offset for each channel, and wherein
for each channel, according to the statistical result of the data to be quantized corresponding to the channel, the determining of the quantization parameter corresponding to the channel includes:
for each channel, according to the statistical result of the data to be quantized corresponding to the channel, determining the offset corresponding to the channel.

13. The non-transitory computer-readable storage medium of claim 12, wherein the determining of the statistical result of the data to be quantized corresponding to each channel according to the data to be quantized includes:
for each channel, determining an absolute maximum value of the data to be quantized corresponding to the channel; and
determining the absolute maximum value of the data to be quantized corresponding to the channel as the statistical result of the data to be quantized corresponding to the channel.

14. The non-transitory computer-readable storage medium of claim 13, wherein for each channel, the determining of the absolute maximum value of the data to be quantized corresponding to the channel includes:
for each channel, determining a maximum value and a minimum value of the data to be quantized corresponding to the channel; and
determining the absolute maximum value of the data to be quantized corresponding to the channel according to the maximum value and the minimum value of the data to be quantized corresponding to the channel.

15. A data quantization processing apparatus comprising:
a first determining circuit configured to, according to a quantity of channels of an input image in a deep convolution layer, determine data to be quantized corresponding to each channel of the input image;
a second determining circuit configured to, according to the data to be quantized corresponding to each channel, determine a statistical result of the data to be quantized corresponding to each channel;
a third determining circuit configured to, for each channel, according to the statistical result of the data to be quantized corresponding to the channel, determine a quantization parameter corresponding to the channel; and
a quantization circuit configured to quantize the data to be quantized corresponding to each channel by using the quantization parameter corresponding to each channel to obtain quantized data corresponding to each channel of the input image,
wherein the number of channels of the input image in the deep convolution layer is the same as the number of channels of an output image;
wherein the quantization parameter includes a point position parameter for each channel; and the third determining circuit is further configured to:
for each channel, determine the point position parameter corresponding to the channel according to the statistical result of the data to be quantized corresponding to the channel and a data bit width corresponding to the channel; and
for each channel, adjust the data bit width corresponding to the channel according to a quantization error of the data bit width corresponding to the channel, so as to determine the quantization parameter corresponding to the channel by using an adjusted data bit width, wherein the quantization error is determined based on the quantized data corresponding to the channel and the data to be quantized corresponding to the channel.

16. An artificial intelligence chip, comprising the data quantization processing apparatus of claim 15.

17. An electronic device, comprising the artificial intelligence chip of claim 16.

* * * * *